(12) United States Patent
Han

(10) Patent No.: US 8,183,598 B2
(45) Date of Patent: May 22, 2012

(54) SEMICONDUCTOR DEVICE, SEMICONDUCTOR MODULE, AND ELECTRONIC APPARATUS INCLUDING PROCESS MONITORING PATTERN OVERLAPPING WITH I/O PAD

(75) Inventor: Dong-Hyun Han, Gunpo-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 58 days.

(21) Appl. No.: 12/588,681

(22) Filed: Oct. 23, 2009

(65) Prior Publication Data

US 2010/0102318 A1 Apr. 29, 2010

(30) Foreign Application Priority Data

Oct. 24, 2008 (KR) .................. 10-2008-0104953

(51) Int. Cl.
  *H01L 27/10* (2006.01)
(52) U.S. Cl. ............... 257/203; 257/211; 257/E21.678; 257/E21.691
(58) Field of Classification Search ............ 257/48, 257/202, 203, 211, 784, 786, E21.645, E21.649, 257/E21.691, E21.678; 438/618, 672, 675, 438/257

See application file for complete search history.

(56) References Cited

U.S. PATENT DOCUMENTS

2004/0126962 A1* 7/2004 Ma et al. ................. 438/248
2007/0254384 A1* 11/2007 Yuasa ....................... 438/5

FOREIGN PATENT DOCUMENTS

| KR | 10-2004-0058651 A | 7/2004 |
| KR | 10-2006-0046876 A | 5/2006 |
| KR | 10-2008-0040811 A | 5/2008 |

* cited by examiner

Primary Examiner — David Vu
(74) Attorney, Agent, or Firm — Lee & Morse, P.C.

(57) ABSTRACT

A semiconductor device includes a process monitoring pattern overlapping with an input/output (I/O) pad. The semiconductor device may include a semiconductor substrate having a cell array region and a peripheral circuit array region, and a plurality of process monitoring patterns disposed in the peripheral circuit array region. The semiconductor device may further include a plurality of input/output (I/O) pads, where each I/O pad is disposed on a corresponding process monitoring pattern.

16 Claims, 20 Drawing Sheets

SEMICONDUCTOR DEVICE, SEMICONDUCTOR MODULE, AND ELECTRONIC APPARATUS INCLUDING PROCESS MONITORING PATTERN OVERLAPPING WITH I/O PAD

BACKGROUND

1. Field

Example embodiments relate to a semiconductor device including a process monitoring pattern overlapping with an input/output (I/O) pad, which improves semiconductor device manufacturing productivity.

2. Description of the Related Art

One among various ways for improving the productivity of a semiconductor device is to increase the number of semiconductor chips per wafer. A typical semiconductor device manufacturing process is performed in wafer units, as such the costs required to process single wafers may remain constant irrespective of the number of semiconductor chips on each wafer. Thus, if the number of semiconductor chips obtained by processing a single wafer is increased, the unit cost of the semiconductor device may be decreased. Therefore, the overall yield may be increased, and the productivity of the semiconductor device may also be increased.

SUMMARY

Example embodiments are directed to reducing an area occupied by a semiconductor chip on a wafer where a semiconductor device may include a process monitoring pattern that overlaps with an input/output (I/O) pad, which substantially overcome one or more of the problems due to the limitations and disadvantages of the related art.

It is therefore a feature of an exemplary embodiment to provide a semiconductor device that may include a plurality of process monitoring patterns that overlap with an I/O pad array region, which also substantially overcome one or more of the problems due to the limitations and disadvantages of the related art.

At least one of the above and other features and advantages may be realized by providing a semiconductor device that includes a semiconductor substrate having a cell array region and a peripheral circuit array region, a plurality of process monitoring patterns disposed in the peripheral circuit array region, and a plurality of input/output (I/O) pads, each I/O pad may be disposed on at least one corresponding process monitoring pattern. Furthermore, the I/O pad and the corresponding process monitoring pattern may be vertically aligned and overlap each other.

Moreover, the plurality of process monitoring patterns may include a first process monitoring pattern on the semiconductor substrate having a first oxide pattern. The plurality of process monitoring patterns may further include a second process monitoring pattern including a conductive material layer disposed on substantially an entire planar surface of the second process monitoring pattern. Furthermore, the plurality of process monitoring patterns may include a third process monitoring pattern having a second oxide pattern with at least one opening and a conductive material pattern filling the at least one opening. Moreover, the plurality of process monitoring patterns may include a fourth process monitoring pattern having a fourth oxide pattern disposed on substantially an entire planar surface of the fourth process monitoring pattern.

The semiconductor device may further include a trench in the semiconductor substrate, where the first oxide pattern may be disposed in the trench. Moreover, the trench may have a smaller planar area than each of the I/O pads. The semiconductor device may further include a first dam region surrounding a vicinity of the trench. Where the first dam region may be formed in a surface of the semiconductor substrate.

At least one of the above and other features and advantages may also be realized by providing a semiconductor device that includes a circuit region, an input/output (I/O) pad array region, and a plurality of process monitoring patterns overlapping with the I/O pad array region. Where the plurality of process monitoring patterns may be electrically insulated from the I/O pad array region. Additionally, the plurality of process monitoring patterns may include a first process monitoring pattern on the semiconductor substrate having a first oxide pattern, a trench in the semiconductor substrate, and the first oxide pattern filling the trench. The trench may have a smaller planar area than the I/O pad array region.

The plurality of process monitoring patterns may also include a second process monitoring pattern including a conductive material layer disposed on substantially an entire surface of region where the second process monitoring pattern overlaps with the I/O pad array region. Moreover, the plurality of process monitoring patterns may include a third monitoring pattern having a first insulating layer, an opening, and a conductive material pattern, and the first insulating layer may overlap with the I/O pad array region, the opening may overlap with the I/O pad array region and extend through the first insulating layer, and the conductive material pattern may fill the opening. Furthermore, the plurality of process monitoring patterns may include a fourth process monitoring pattern having a second insulating layer on substantially an entire surface of a region where the fourth process monitoring pattern overlaps with the I/O pad array region.

The semiconductor device may further include a first dam region surrounding a vicinity of the trench. Moreover, the third process monitoring pattern may include a second dam region surrounding the opening that overlaps with the I/O pad array region. Where, the second dam region may be a region of the third process monitoring pattern where the first insulating layer is formed.

Example embodiments are directed to reducing an area occupied by a semiconductor substrate having at least two cell array regions and a peripheral circuit array region between the cell array regions, a plurality of process monitoring patterns disposed in the peripheral circuit array region, and a plurality of input/output (I/O) pads, each I/O pad being disposed on at least one corresponding process monitoring pattern, the I/O pads and the corresponding process monitoring pattern are vertically aligned and overlap each other, the plurality of process monitoring patterns include, a first process monitoring pattern including a trench, a first oxide pattern in the trench, a first dam region surrounding a vicinity of the trench, the first dam region being a portion of the semiconductor substrate, a second process monitoring pattern including a conductive material layer disposed on substantially an entire planar surface of the second process monitoring pattern, a third process monitoring pattern including a second oxide pattern with at least one opening and a conductive material pattern filling the at least one opening and a second dam region surrounding the opening, the second dam region being a region of the third process monitoring pattern where the first insulating layer is formed, and a fourth process monitoring pattern including a fourth oxide pattern disposed on substantially an entire planar surface of the fourth process monitoring pattern, wherein the process monitoring patterns are electrically insulated from the I/O pads, and the cell array regions includes semiconductor circuits being electrically connected to the I/O pads.

Example embodiments are directed to reducing an area occupied by a semiconductor chip on a wafer where a semiconductor device may include a circuit region, an input/output (I/O) pad array region including at least one of I/O pads, and a process monitoring pattern overlapping with at least one of the I/O pads.

Example embodiments are directed to a semiconductor module including a module substrate, semiconductor devices disposed on the module substrate, and contact terminals disposed at edge of the module substrate, wherein at least one of the semiconductor devices includes: a semiconductor substrate having a cell array region and a peripheral circuit array region, a plurality of process monitoring patterns disposed in the peripheral circuit array region, and a plurality of input/output (I/O) pads, each I/O pad being disposed on at least one corresponding process monitoring pattern.

Example embodiments are directed to an electronic apparatus including a housing, a memory unit in the housing, the memory unit including a semiconductor device, an input/output unit, and a controller to control the memory unit and the input/output unit, wherein the semiconductor device includes: a semiconductor substrate having a cell array region and a peripheral circuit array region, a plurality of process monitoring patterns disposed in the peripheral circuit array region, and a plurality of input/output (I/O) pads, each I/O pad being disposed on at least one corresponding process monitoring pattern.

Aspects of the exemplary embodiments should not be limited by the above description, and other unmentioned aspects will be clearly understood by one of ordinary skill in the art from example embodiments described herein.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
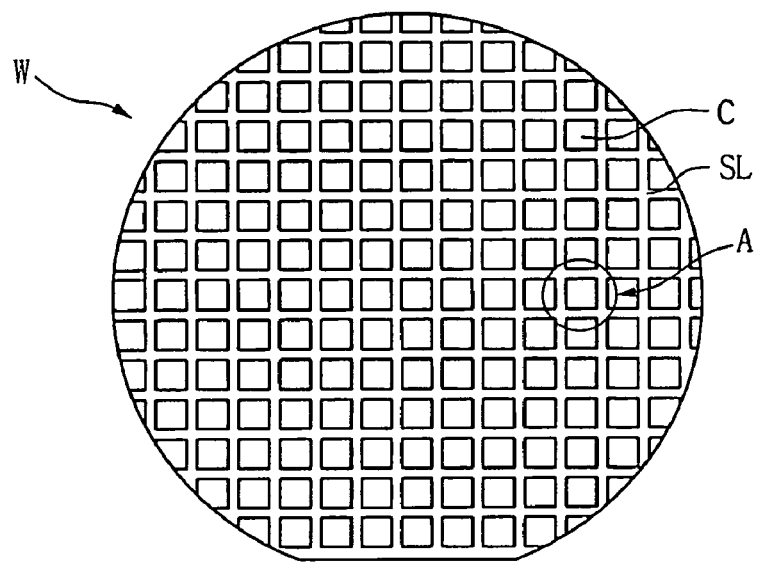
FIG. 1A illustrates a schematic plan view of a single wafer that may be used during a semiconductor manufacturing process.

Korean Patent Application No. 10-2008-0104953, filed on Oct. 24, 2008, in the Korean Intellectual Property Office, and entitled: "Semiconductor Device Including Process Monitoring Pattern Overlapping with I/O Pad," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Example embodiments are described herein with reference to plan and cross section illustrations that are schematic illustrations of idealized exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. Thus, the regions illustrated in the figures are schematic in nature and their shapes are not intended to illustrate the precise shape of a region, and are not intended to limit the scope of the inventive concept.

One among various ways to increase the number of semiconductor chips per wafer is to reduce an area occupied by each semiconductor chip. A vast amount of research is continuously being conducted on shrinking the size of semiconductor chips. Another way to increase to the number of semiconductor chips per wafer is to shrink a scribe lane interposed between the semiconductor chips. Both ways for increasing the number of semiconductor chips per wafer have their advantages and disadvantages.

In regard to the scribe lane, typically various patterns and structures for monitoring a semiconductor manufacturing process may be formed on the scribe lane. For example, oxide sites (OS), test element groups (TEGs), alignment keys having various functions, dummy patterns, etc., may be formed on the scribe lane. Generally, the oxide sites (OS) may require a comparatively larger area. The oxide sites function may be capable of monitoring processes of forming various oxide patterns. Specifically, the oxide sites may be used to measure the deposited thicknesses or etched depths of various oxide layers or oxide patterns. Although the term "oxide sites" may be used to describe the corresponding elements, the elements are not limited by the term and the elements can be used to monitor the entire semiconductor manufacturing process. In the present specification, for simplicity, the processes of forming oxide sites will be chiefly referred to, but the scope of the exemplary embodiments should not be construed as being limited to oxide sites.

In regard to oxide sites, the number of semiconductor chips per wafer may be increased by reducing an area of the oxide sites. However, introducing expensive high-resolution measuring apparatuses, which may fit in the reduced area, in order to measure the dimensions of oxide layers or oxide patterns using the oxide sites may be difficult in practice. Also, since oxide patterns may be formed in large areas during processing of wafers, the oxide patterns may need to be monitored in oxide sites with the largest possible area in order to obtain precise measurement results. In conclusion, when oxide sites shrink, the number of semiconductor chips per wafer may be increased, but precise monitoring of the processing of wafers may become more difficult.

In other words, there is a trade-off related with shrinking of oxide sites in the scribe lane. Thus, it is being proposed that the oxide sites may be shifted from the scribe lanes to other regions of the wafer, which may improve both the yield and productivity of the semiconductor manufacturing process.

For example, the oxide sites may overlap with I/O pad array regions of a semiconductor chip. In an exemplary embodiment, the I/O pad array regions may be provided in a square shape. Each side of the square shape of the I/O pad array region may reach several tens of mm. Thus, the I/O pad array regions may provide sufficiently large enough areas for oxide sites to adequately monitor oxide forming processes. Also, the I/O pad array regions may function as circuits during metal processes that occur relatively late in the manufacturing process, and circuit patterns are generally not formed until the metal processes are performed. Therefore, by consideration of designs and processes related with I/O pad array regions, processes performed in oxide sites may be performed in regions where I/O pads will be formed at a later time during the manufacturing process.

In the present specification, for simplicity, oxide sites will hereafter be referred to as "process monitoring patterns." The "process monitoring patterns" may mean "patterns are used to monitor any processes" or "process monitorable patterns". Moreover, the technical scope of the exemplary embodiments will now be described in detail with reference to the attached drawings.

Figure 1B:
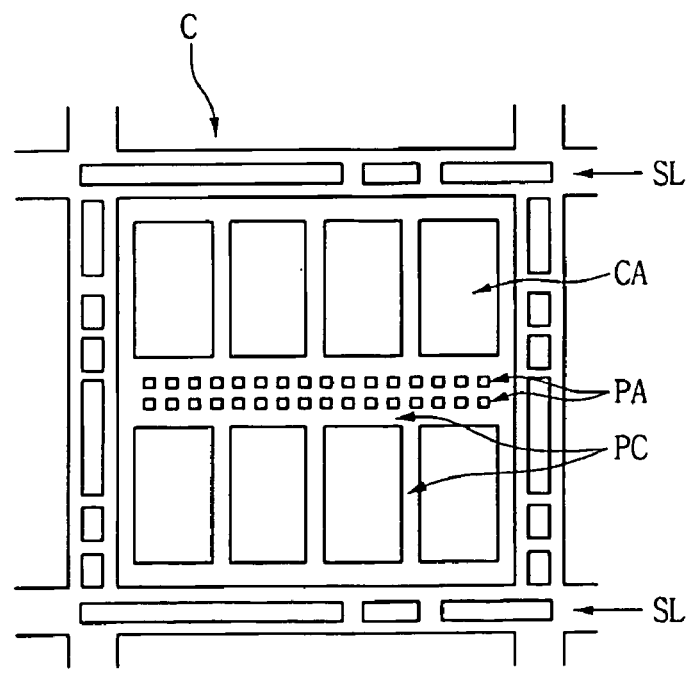
FIG. 1B illustrates an enlarged view of region "A" of FIG. 1A, which illustrates a plan view of a semiconductor chip.

FIG. 1A illustrates a schematic plan view of a single wafer used during a semiconductor manufacturing process, and FIG. 1B illustrates an enlarged view of region "A" of FIG. 1A. Referring to FIG. 1A, several tens to several hundreds of semiconductor chips (or dies) C may be formed on a wafer W. Boundary regions, called scribe lanes SL, may be present between the respective semiconductor chips C. That is, the semiconductor chips C and the scribe lanes SL disposed therebetween may be provided on the wafer W.

Typically, wafers W may be classified into a flat-zone type and a notch type. FIG. 1A exemplarily illustrates a flat-zone type wafer W. However the scope of the exemplarily embodiments is not limited to the flat-zone type or notch type wafers, and could readily be adapted to different types of wafers. Moreover, although the semiconductor chips C may be formed into various shapes including quadrilateral shapes, FIG. 1A exemplarily illustrates square semiconductor chips C for simplicity.

Referring to FIG. 1B, a single semiconductor chip C may include cell array regions CA and peripheral circuit array regions PC. Among the peripheral circuit array regions PC, a plurality of array regions PA and a plurality of input/output (I/O) pads may be disposed in a center area of the peripheral circuit array regions PC. In other words, the semiconductor chip C may include the cell array regions CA that may function as a circuit region, the peripheral circuit array regions PC that may also function as a circuit region, and the I/O pad array regions PA that may function as a non-circuit region.

As discussed above, the semiconductor chip C may include the circuit regions CA and PC, and non-circuit regions PA. The term "non-circuit region" is not synonymous with the I/O pad array region PA. Various test pattern regions, monitoring pattern regions, and/or alignment key pattern regions may be formed on an outer region (i.e., scribe lane SL) of the semiconductor chip C. These patterns may be changed into various shapes according to necessity, thus, it is not necessary to describe specific shapes of the patterns. Also, for simplicity, the plurality of I/O pad array regions PA are illustrated in the peripheral circuit array regions PC with special circuit blocks omitted. It should be understood that FIG. 1B is not a plan view of a specific semiconductor manufacturing process but a plan view of any process operation of the entire semiconductor manufacturing process.

FIGS. 2A through 10B are schematic diagrams illustrating processes of forming process monitoring patterns MP in exemplary I/O pad array regions PA according to various example embodiments. In the exemplary embodiments, an I/O pad array region PA may overlap with a process monitoring pattern MP. For simplicity, the I/O pad array regions PA are illustrated with a square shape. The exemplary embodiments may be applied to various semiconductor devices, for simplicity, the exemplary embodiments will be described as applied to a dynamic random access memory (DRAM).

Figure 2A:
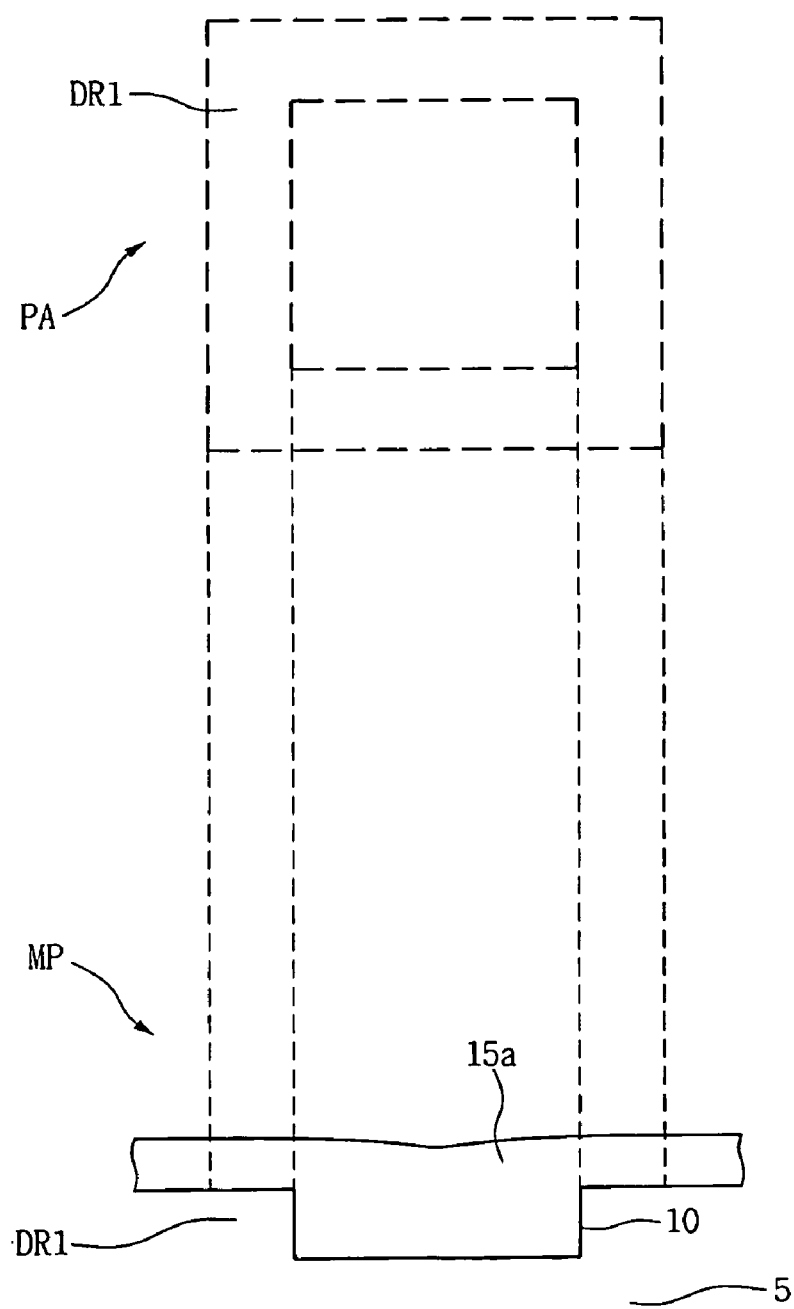
FIGS. 2A through 10B illustrate conceptual diagrams of processes for forming process monitoring patterns in I/O pad array regions according to various exemplary embodiments.
Figure 2B:
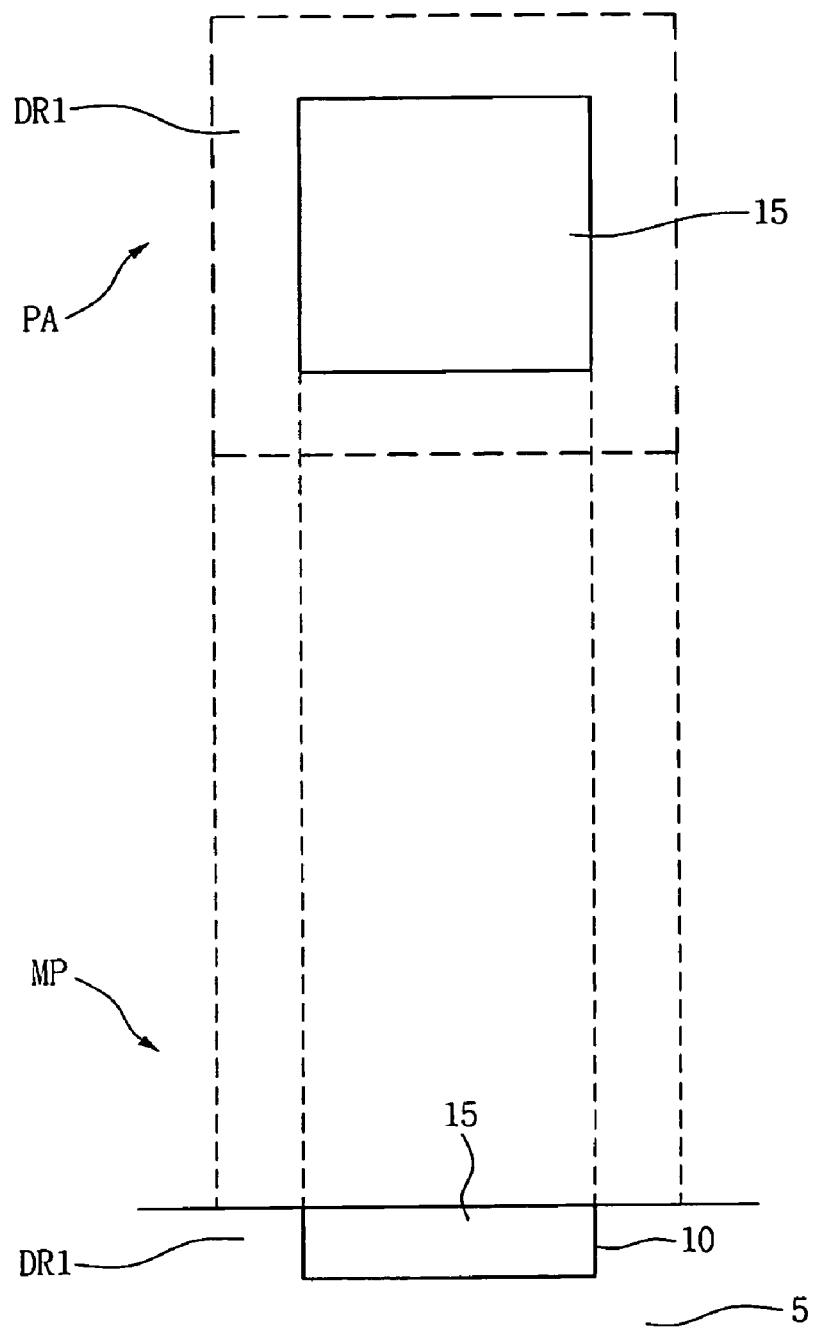

FIGS. 2A and 2B illustrate a plan view and a longitudinal cross-sectional view of the semiconductor chip having the I/O pad array region PA where the process monitoring pattern MP is formed, according to exemplary embodiments. The process monitoring pattern MP may be a monitoring pattern to monitor a process of forming an isolation pattern, such as for example a shallow trench isolation (STI) pattern, as shown in FIGS. 2A and 2B.

Referring to FIG. 2A, a trench 10 may be formed in a semiconductor substrate 5 overlapping with the I/O pad array region PA, and a first oxide layer 15a may be formed on substantially an entire surface of the semiconductor substrate 5 to fill the trench 10. Moreover, the process monitoring pattern MP in the I/O pad array region PA may be employed to measure the deposited thickness of the first oxide layer 15a. Additionally, a planarization process, for example chemical mechanical planarization process (CMP), may be used to remove excess portions of the first oxide layer 15a from the surface of the semiconductor substrate 5.

Referring to FIG. 2B, a first oxide pattern 15 may be obtained by filling only the trench 10 with an oxide. The first oxide pattern 15 may be formed in a shape of an isolation pattern. Moreover, in an exemplary embodiment the first oxide pattern 15 in the I/O pad array region PA is formed simultaneously with the isolation pattern, thus, a process of forming the isolation pattern may be monitored. Specifically, the semiconductor substrate 5 may be etched, the first oxide layer 15a may be formed, and the thickness of the first oxide layer 15a may be measured. Alternatively, after the first oxide pattern 15 is formed using a planarization process, the thickness of the first oxide pattern 15 may be measured. As a result, the process of forming the isolation pattern, such as an STI pattern, may be monitored.

Referring to FIGS. 2A and 2B, a first dam region DR1 may be formed at an outer portion of the I/O pad array region PA, that is, in the vicinity of the first oxide pattern 15,15a. The first dam region DR1 refers to a region where a first dam (not shown) may be formed. In an exemplary embodiment, the first dam may be formed and removed simultaneously with a pad insulating layer that is formed and removed during the formation of the isolation pattern on the substrate. The first dam region DR1 may protect the first oxide pattern 15,15a in the trench 10 and real circuit patterns adjacent to the process monitoring pattern MP from damage that may occur during various semiconductor manufacturing processes.

The first dam region DR1, for example, may protect patterns that are already formed and/or patterns that are to be formed from unexpected damage during a chemical mechanical polishing (CMP) process, an etching process, and a process of forming a mask pattern (e.g., photoresist pattern), which may damage material layers. The first dam may be formed in the first dam region DR1 and function as a stopper during a CMP process. In an exemplary embodiment, the first oxide pattern 15 may be provided to a smaller area than the area of the I/O pad array region PA, and a portion of the I/O pad array region PA on which the first oxide pattern 15 is not formed may function as the first dam region DR1.

The first dam is an optional element according to the technical scope of the exemplary embodiments. However, in consideration of a typical CMP process, a dam element may be preferable, though not necessary, to protect the process monitoring pattern MP and/or its adjacent real circuit patterns. Furthermore, a plurality of first dams may be prepared to various widths and intervals according to a designer's intentions. For example, as shown in FIG. 2B the first dam may be a single-layer first dam formed in the outer portion of the I/O pad array region PA. Alternatively, the first dam may have a different shape and structure, for example, the first dam may be a multilayered first dam, a line-and-space-type dam, or a lattice-type dam. The shape and structure of the first dam may be freely changed according to the characteristic of each semiconductor device or process.

As described above, the first dam region DR1 may protect patterns from damage during a CMP process. More specifically, the first dam region DR1 may prevent and alleviate a variation in the thickness of the first oxide pattern 15 (e.g., dishing) during a CMP process. Furthermore, because the first dam region DR1 and the first oxide pattern 15 are formed of different materials, they may have a CMP selectivity with respect to each other. Additionally, the first dam region DR1 may directly function as the first dam.

A planar area of the first oxide pattern 15 in the I/O pad array region PA may be variously changed according to designer's intentions, and thus it will not be explained numerically. However, the thickness of the first oxide pattern 15 in the I/O pad array region PA may be similar to that of a field oxide of the isolation pattern. As the planar area of the first oxide pattern 15 may be closely apportioned to that of isolation pattern, the process of forming the isolation pattern may be monitored more precisely. On the other hand, when the planar area of the first oxide pattern 15 is excessively fine measuring the planar area of the first oxide pattern 15 may become difficult. Accordingly, the planar area of the first oxide pattern 15 may be variously changed according to the resolution of a measuring apparatus.

Figure 3:
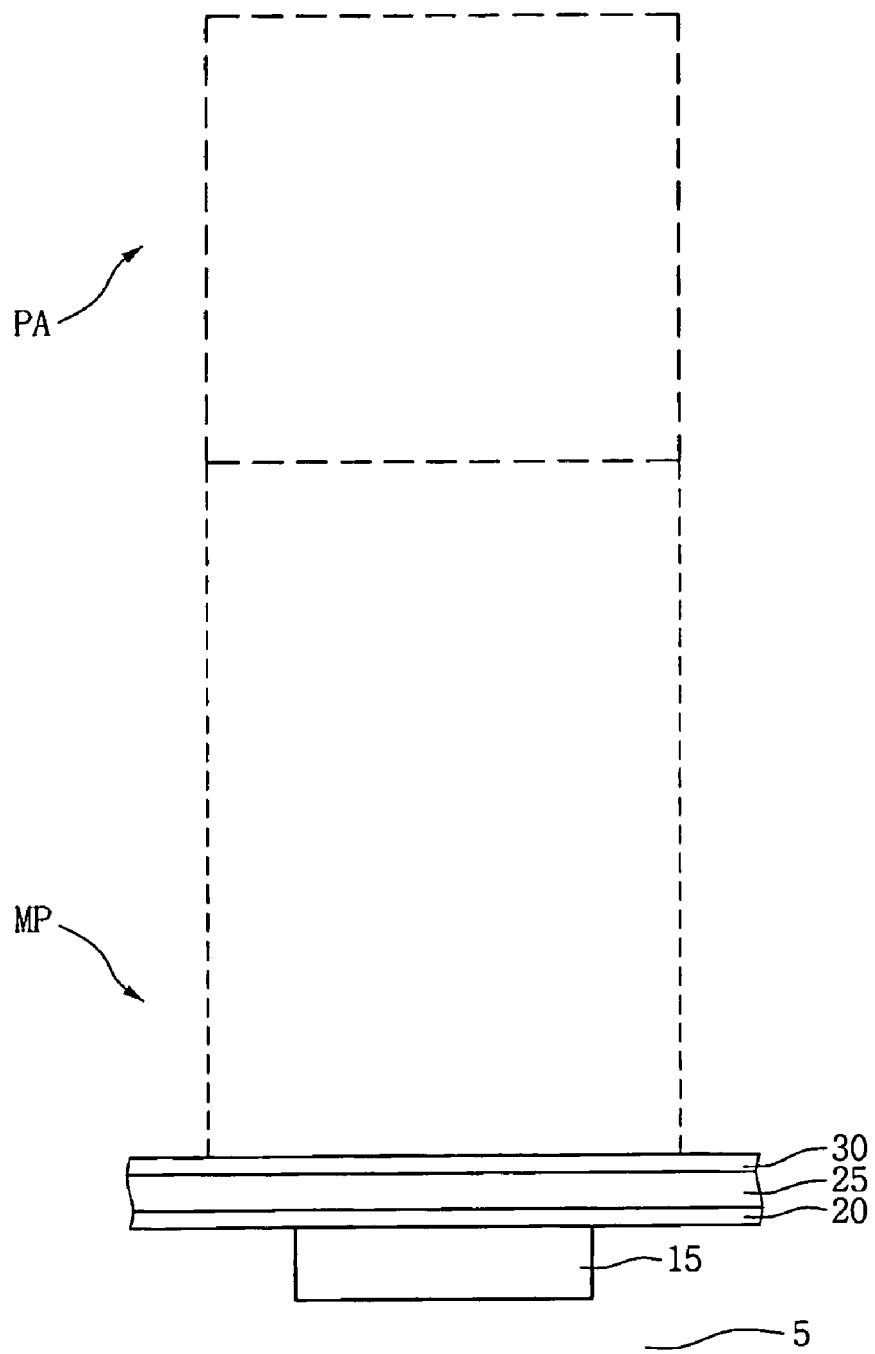

FIG. 3 is a plan view and a longitudinal cross-sectional view of the semiconductor chip having the I/O pad array region PA where the process monitoring pattern MP is formed, according to exemplary embodiments. Specifically, FIG. 3 illustrates the process monitoring pattern MP formed in one of the I/O pad array regions PA during formation of a gate pattern.

Referring to FIG. 3, a first insulating layer 20, a first conductor 25, and a first capping layer 30 may be formed on substantially an entire I/O pad array region PA. The first insulating layer 20 may be formed simultaneously with a gate insulating layer during the formation of the gate pattern. The first insulating layer 20 may be formed of, e.g., silicon oxide or hafnium oxide. The first conductor 25 may be formed simultaneously with a gate electrode layer during the formation of the gate pattern. Although FIG. 3 illustrates a single-layered first conductor 25, a multi-layered first conductor 25 may be provided. The first capping layer 30 may be formed simultaneously with a gate capping layer during formation of a gate electrode. The first capping layer 30 may be formed of silicon nitride or silicon oxynitride. In this case, after each of the first insulating layer 20, the first conductor 25, and the first capping layer 30 is formed, the thicknesses of the respective material layers may be individually measured each time.

Figure 4A:
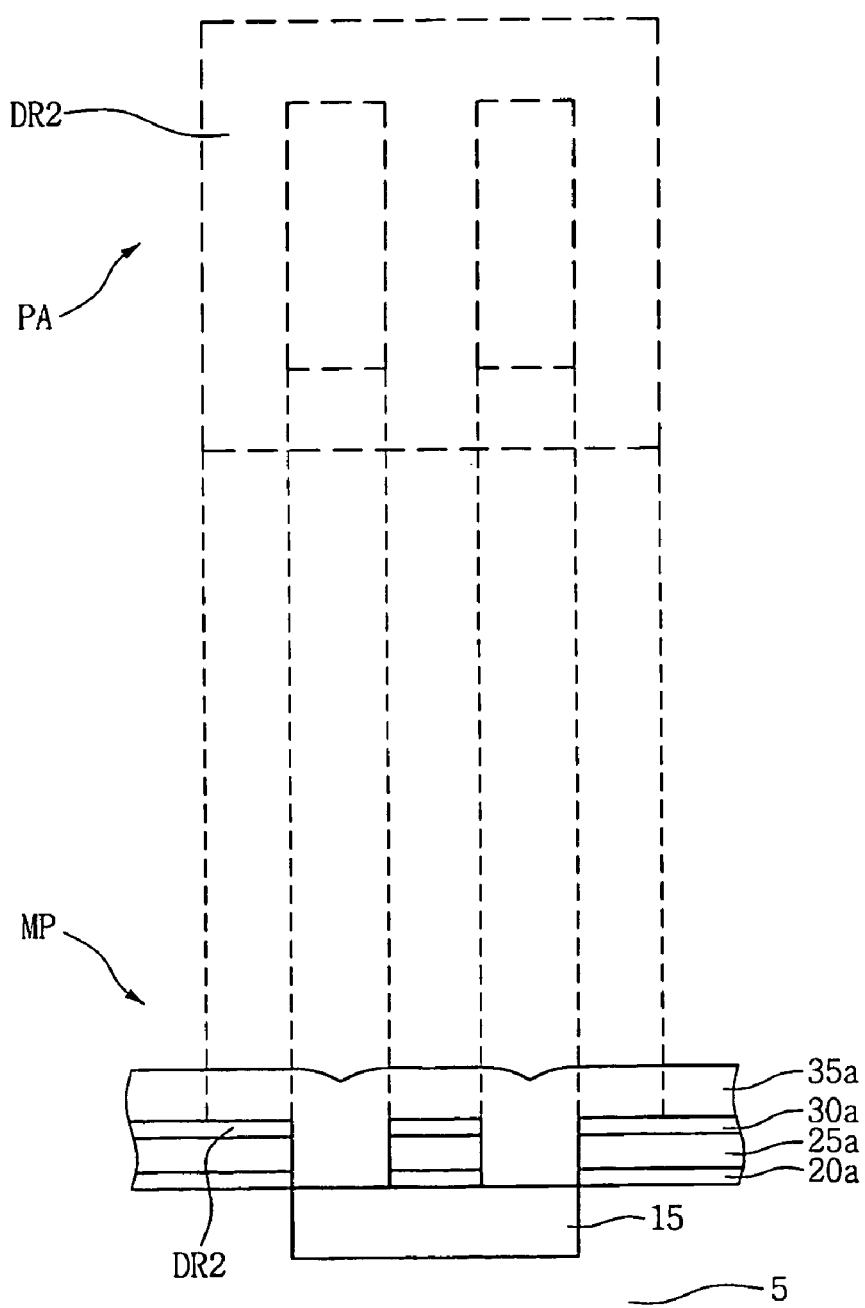
Figure 4B:
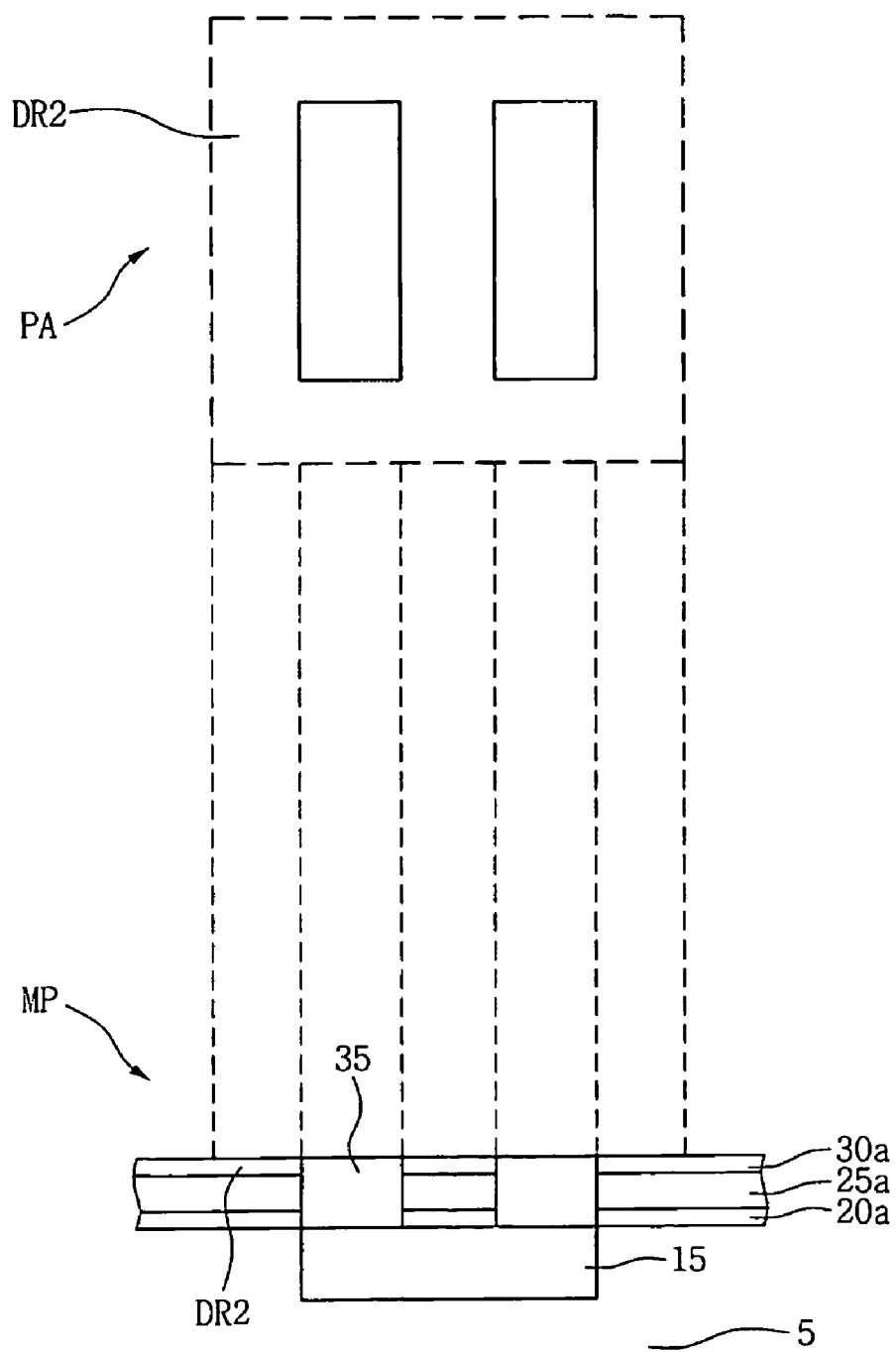

FIGS. 4A and 4B each illustrate a plan view and a longitudinal cross-sectional view of the semiconductor chip having the I/O pad array region PA where the process monitoring pattern MP is formed, according to exemplary embodiments. Specifically, FIGS. 4A and 4B illustrate a line-and-space-type process monitoring pattern MP formed in the I/O pad array region PA during formation of the gate pattern.

Referring to FIG. 4A, a first insulating layer pattern 20a, a first conductor pattern 25a, and a first capping layer pattern 30a may be formed in the I/O pad array region PA. Each of the first insulating layer pattern 20a, first conductor 25a and first capping layer pattern 30a may be patterned in a line or bar shape, and then a second oxide layer 35a may be formed therebetween and on a surface of the first capping layer pattern 30a. In this case, before and/or after each of the first insulating layer pattern 20a, the first conductor pattern 25a, the first capping layer pattern 30a, and the second oxide layer 35a is formed, the thicknesses of the respective material layers may be individually measured each time.

The second oxide layer 35a may be formed simultaneously with a first interlayer insulating layer. The first interlayer insulating layer refers to an insulating material formed between gate patterns during a DRAM semiconductor manufacturing process. In an exemplary embodiment, the first capping layer pattern 30a may function as a second dam region DR2 or a second dam. Moreover, the second dam region DR2 and second dam may have the same function and serve the same purpose as the first dam region DR1 and first dam as discussed above.

Referring to FIG. 4B, the second oxide layer 35a may be planarized using a planarization process, such as a CMP process, to form a second oxide pattern 35. The second oxide pattern 35 may be formed between the first insulating layer pattern 20a, the first conductor pattern 25a, and the first capping layer pattern 30a. When the second oxide pattern 35 is formed, the first interlayer insulating layer may also be influenced by the planarization process. Furthermore, the first capping layer pattern 30a in the I/O pad array region PA may function as the second dam region DR2 or the second dam. In an exemplary embodiment, after the second oxide pattern 35 is formed, its thickness may be measured.

Figure 5:
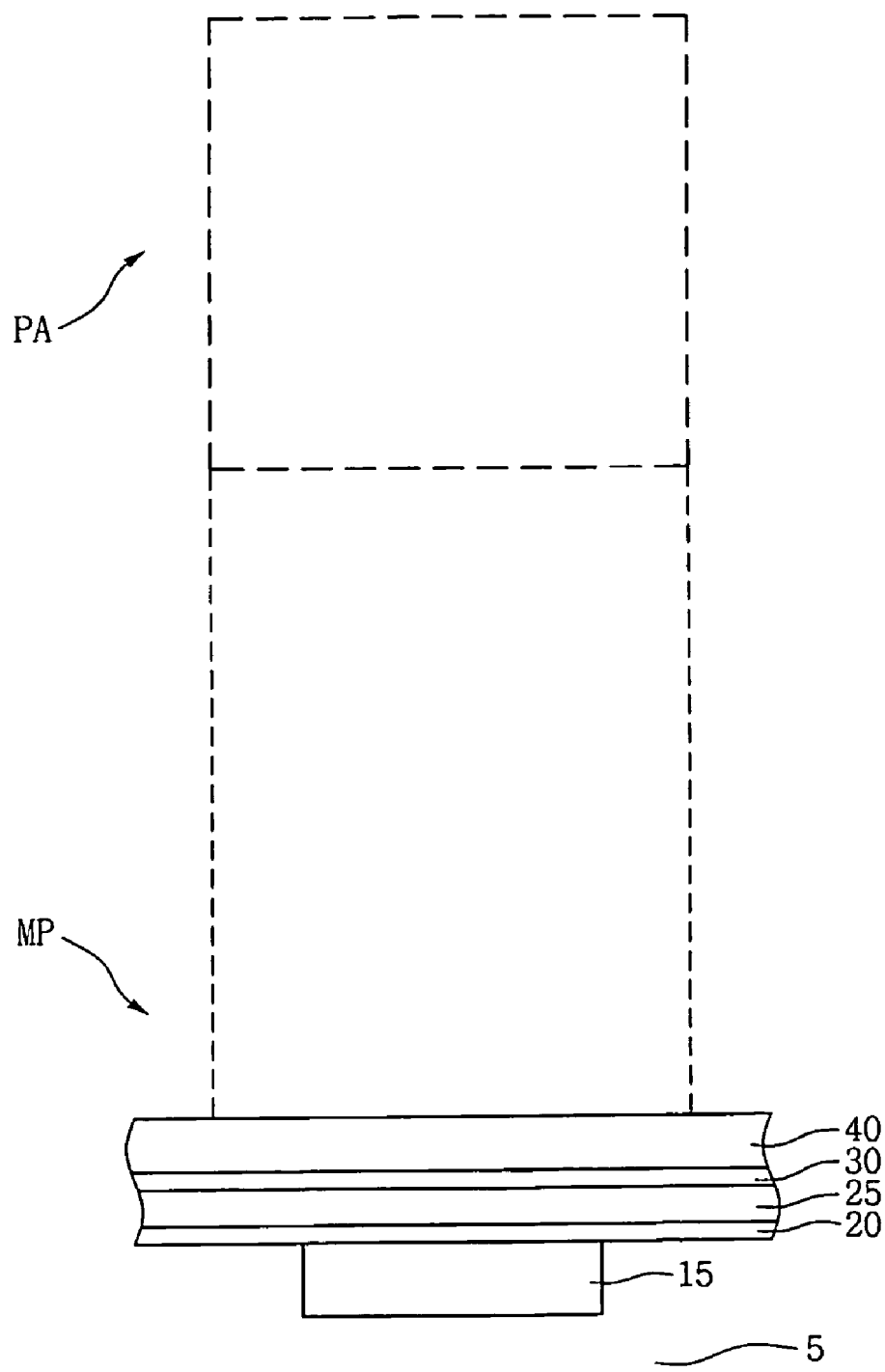

FIG. 5 illustrates a plan view and a longitudinal cross-sectional view of the semiconductor chip having the I/O pad array region PA where the process monitoring pattern MP is formed, according to exemplary embodiments. Specifically, FIG. 5 illustrates the process monitoring pattern MP in the I/O pad array region PA during formation of a second interlayer insulating layer 40. Although the example embodiments illustrated in FIGS. 4A and 4B may be adapted to this exemplary embodiment, the example embodiment illustrated in FIG. 3 is applied for simplicity.

The second interlayer insulating layer 40 may be formed on substantially an entire first capping layer 30. A second capping layer (not shown) may be formed on the second interlayer insulating layer 40. The second capping layer may be formed of a harder material than the second interlayer insulating layer 40. For example, when the second interlayer insulating layer 40 is formed of silicon oxide, the second capping layer may be formed of silicon nitride or silicon oxynitride. The second capping layer is omitted from FIG. 5 for simplicity. In an exemplary embodiment, after the second interlayer insulating layer 40 is formed, its thickness may be measured.

Figure 6A:
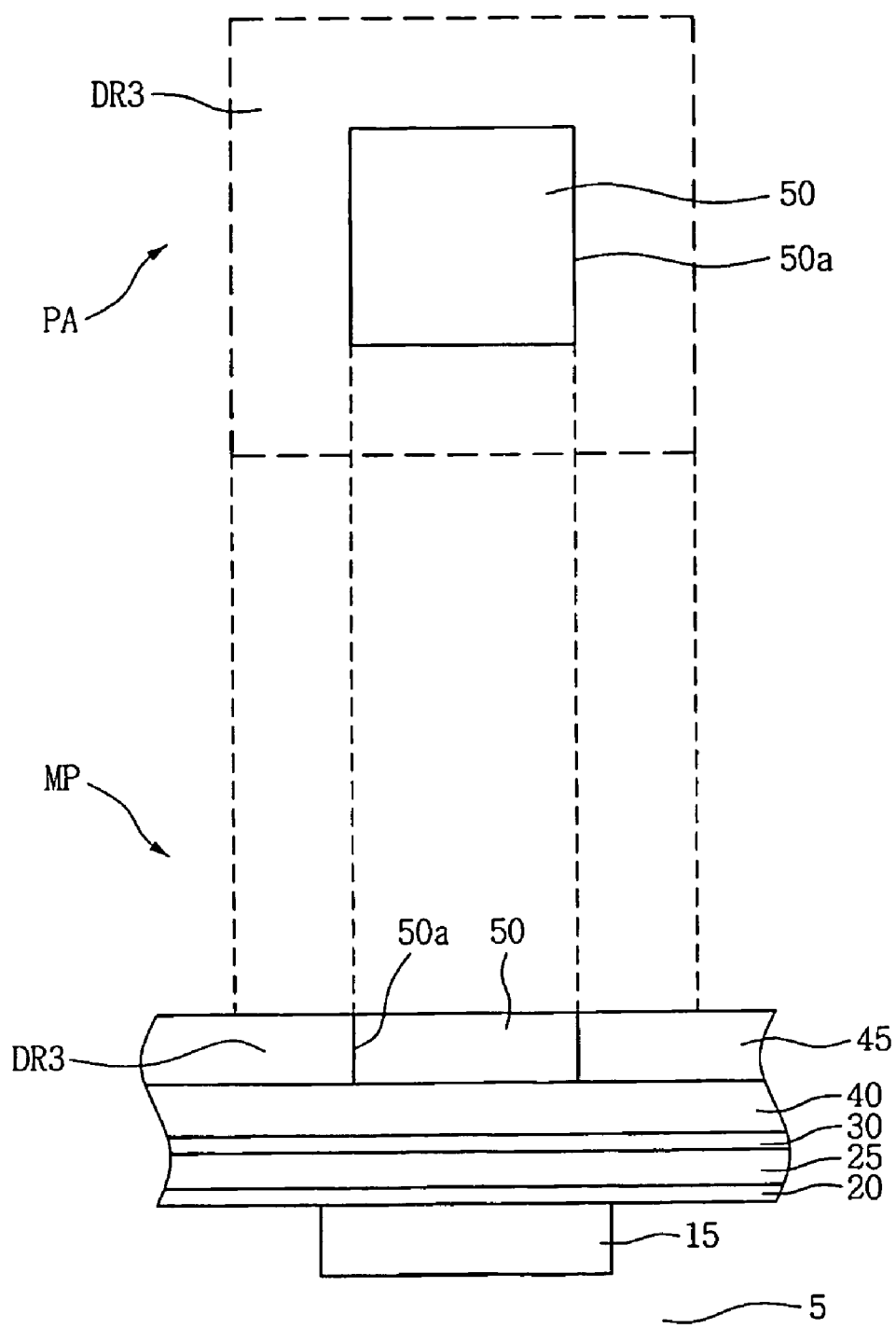
Figure 6B:
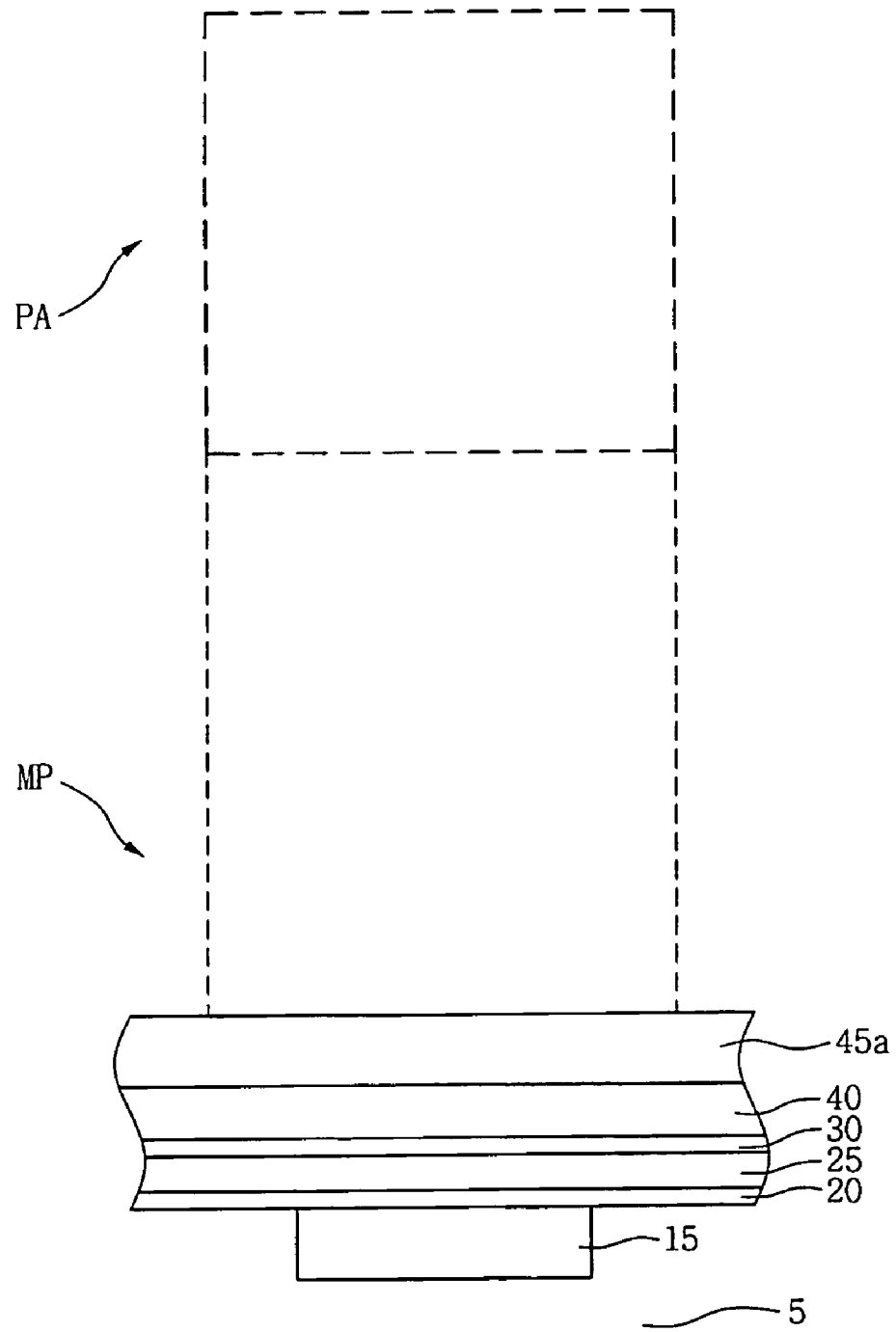

FIGS. 6A and 6B each illustrate a plan view and a longitudinal cross-sectional view of the semiconductor chip having the I/O pad array region PA where the process monitoring pattern MP is formed, according to exemplary embodiments. Specifically, FIGS. 6A and 6B illustrate a process of forming the process monitoring pattern MP in the I/O pad array region PA during formation of a direct contact (DC).

Referring to FIG. 6A, a third interlayer insulating layer pattern 45, a first opening 50a, and a first plug 50 may be formed in the I/O pad array region PA. The first opening 50a may be filled with the first plug 50. In the process of forming a DC hole, the first opening 50a may be formed simultaneously with the DC hole. Also, in the process of forming a DC plug, the first plug 50 may be formed simultaneously with the DC plug. The formation of the first plug 50 may include forming a conductive material in the first opening 50a and on the third interlayer insulating layer pattern 45, and performing a planarization process, such as a CMP process.

In an exemplary embodiment, after an insulating material for forming the third interlayer insulating layer pattern 45 is deposited, its thickness may be measured. Also, before and/or after the first plug 50 is formed, that is, before and/or after the planarization process is performed, the thickness of the deposited conductive material used to form the plug may be measured each time. In an exemplary embodiment, the third interlayer insulating layer pattern 45 may function as a third dam region DR3 or a third dam during the formation of the first plug 50. Moreover, the third dam region DR3 and third dam may have the same function and serve the same purpose as the first dam region DR1 and first dam as discussed above.

Referring to FIG. 6B, it can be seen that, unlike in FIG. 6A, the first opening 50a and the first plug 50 may not be formed. In other words, only the third interlayer insulating layer 45a may be formed. In an exemplary embodiment, after the third interlayer insulating layer 45a is deposited, its thickness may be measured.

Figure 7A:
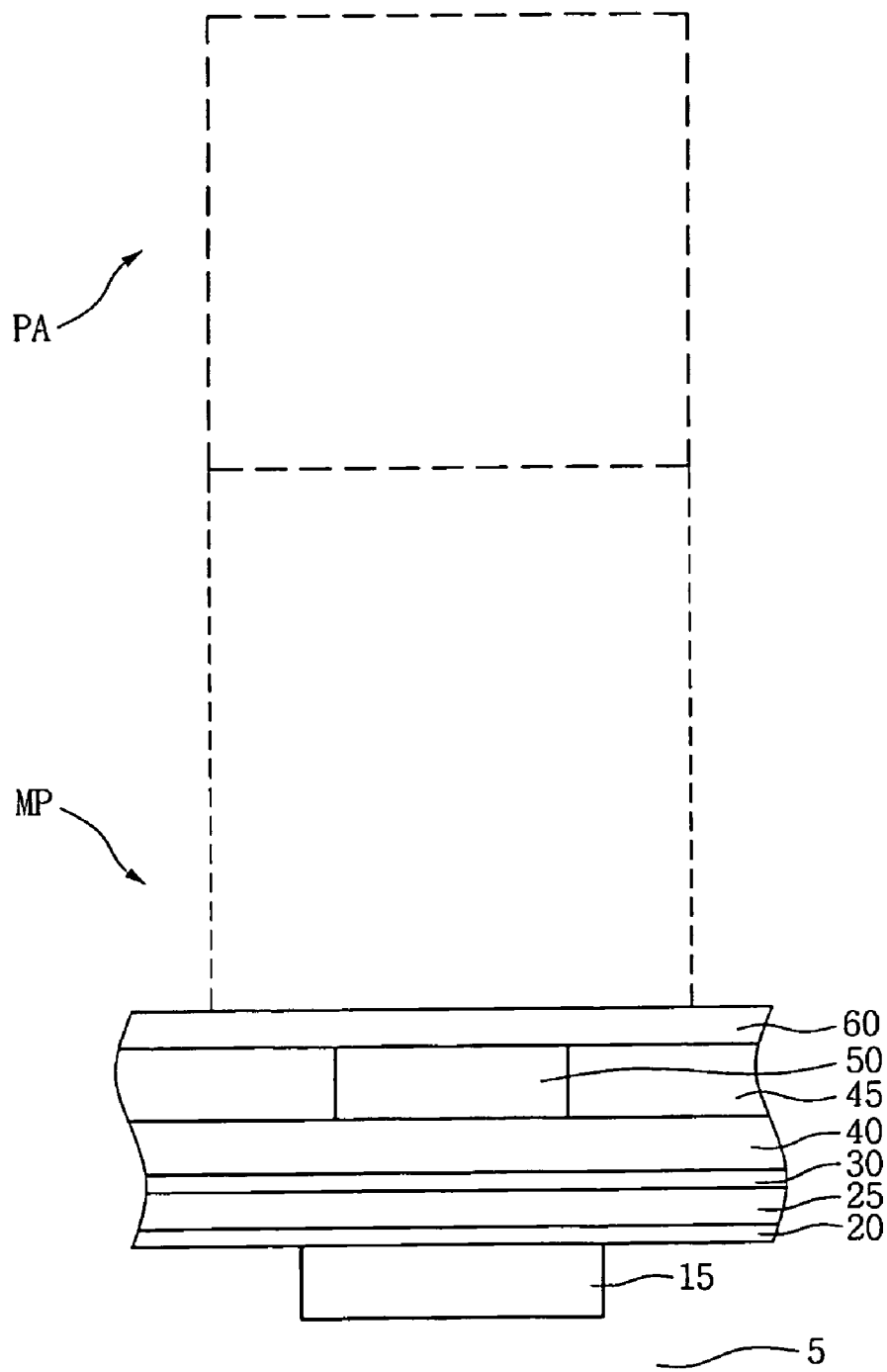
Figure 7B:
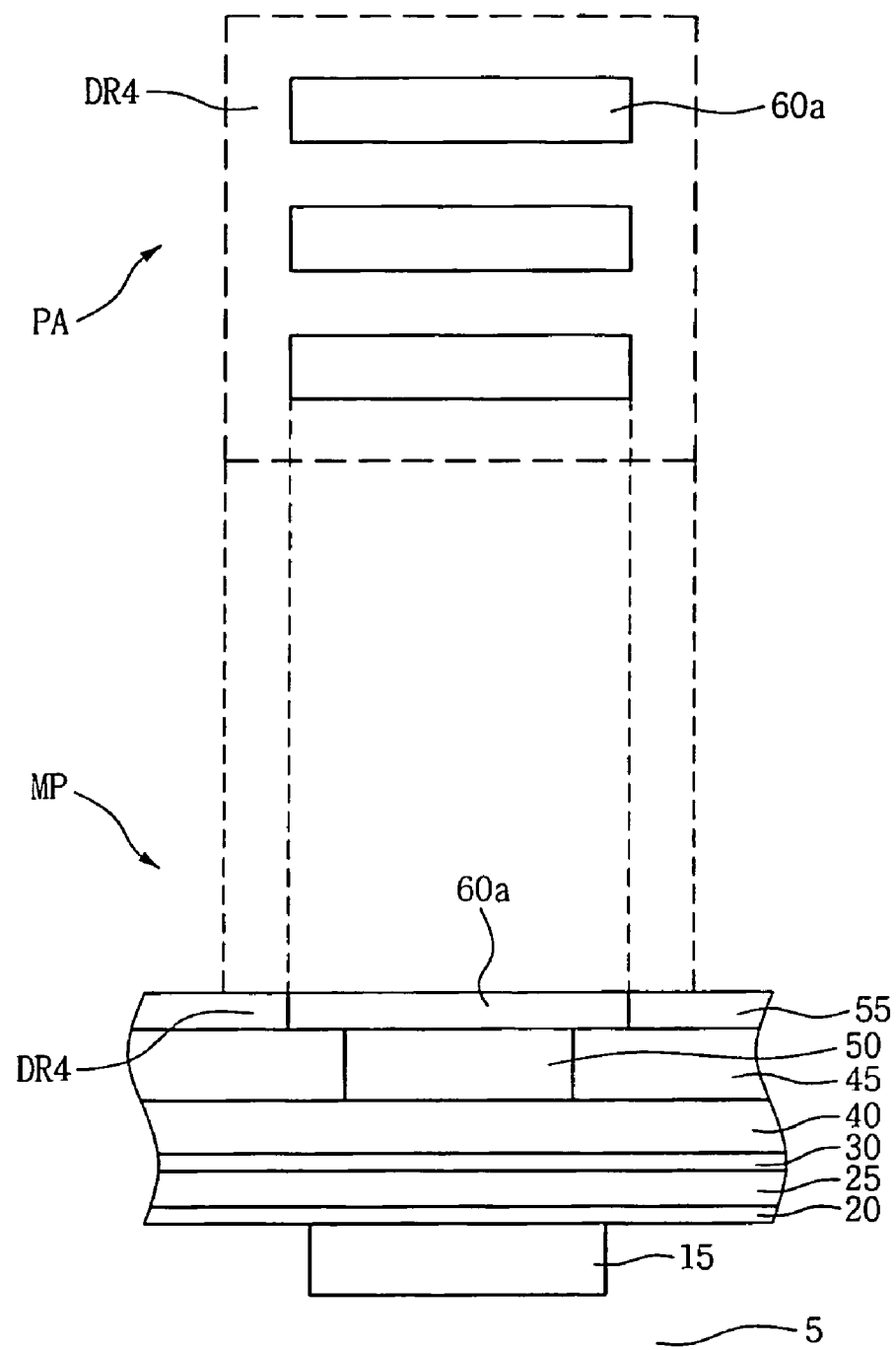

FIGS. 7A and 7B each illustrate a plan view and a longitudinal cross-sectional view of the semiconductor chip having the I/O pad array region PA where the process monitoring pattern MP is formed, according to exemplary embodiments. Specifically, FIGS. 7A and 7B illustrate the process monitoring pattern MP formed in the I/O pad array region PA during formation of a bit line.

Referring to FIG. 7A, a second conductor 60 may be formed in substantially an entire I/O pad array region PA. That is, an insulating layer may not be formed in the I/O pad array region PA. The second conductor 60 may be formed simultaneously with a bit line pattern. Barrier layers (not shown) may be formed above and below the second conductor 60. For simplicity, the barrier layers are omitted from FIGS. 7A and 7B. In an exemplary embodiment, after the second conductor 60 is formed, its thickness may be measured.

Referring to FIG. 7B, a fourth interlayer insulating layer 55 and a second conductor pattern 60a may be formed in the I/O pad array region PA. As shown in FIG. 7B, the second conductor pattern 60a may be formed in a line or bar shape. In order to obtain the patterns shown in FIG. 7B, after the fourth interlayer insulating layer 55 is formed, a conductive material for forming the second conductor pattern 60a may be deposited and planarized using, for example, a CMP process, so that top surfaces of the fourth interlayer insulating layer 55 and the second conductor pattern 60a may have the same height. In an exemplary embodiment, before and/or after both the fourth interlayer insulating layer 55 and the second conductor pattern 60a are formed, that is, before and/or after the planarization process is performed, the thicknesses of the respective material layers may be individually measured. Moreover, the fourth interlayer insulating layer 55 may function as a fourth dam region DR4 or a fourth dam during the formation of the second conductor pattern 60a. Moreover, the fourth dam region DR4 and fourth dam may have the same function and serve the same purpose as the first dam region DR1 and first dam as discussed above.

Figure 8A:
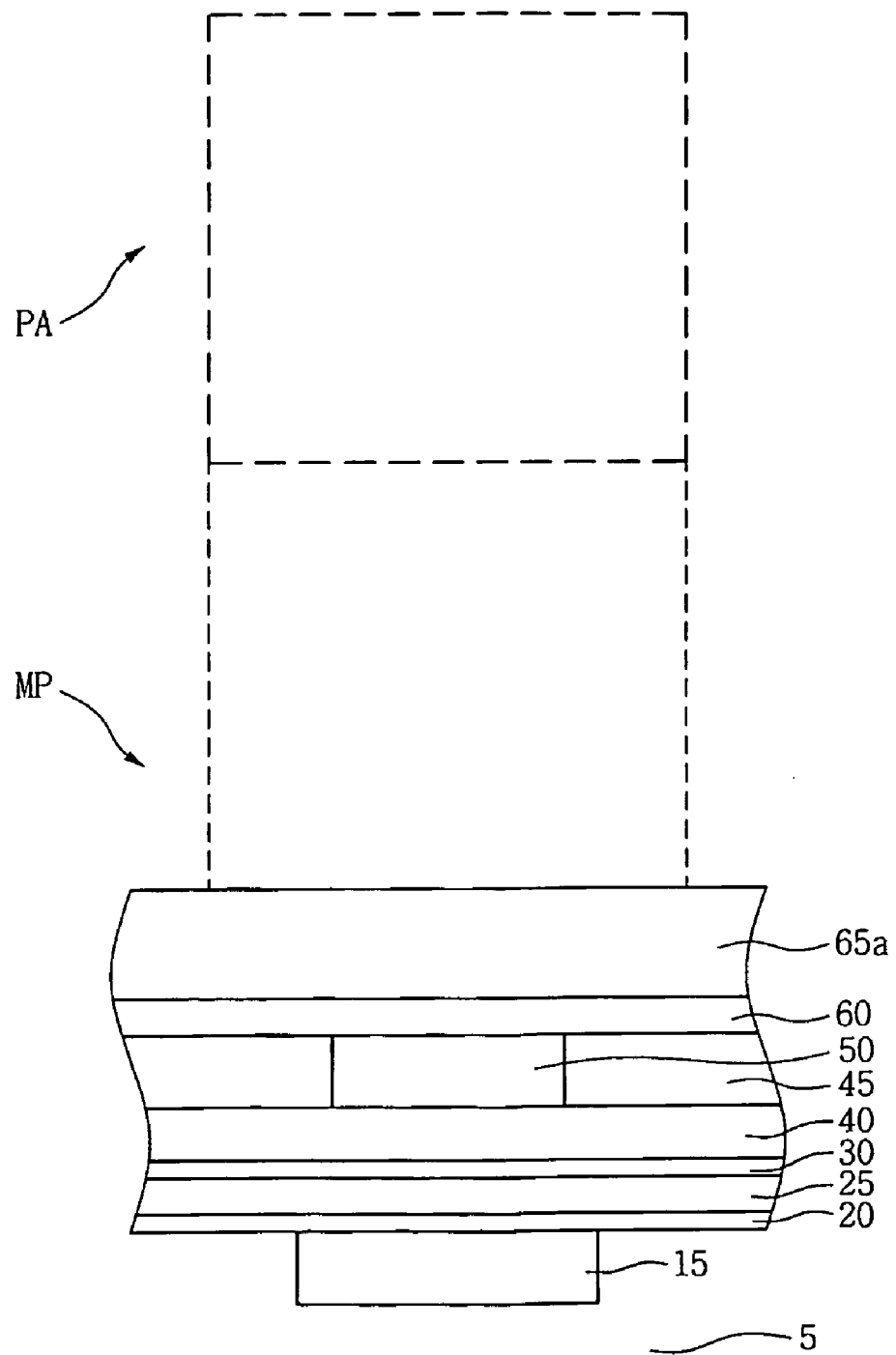
Figure 8B:
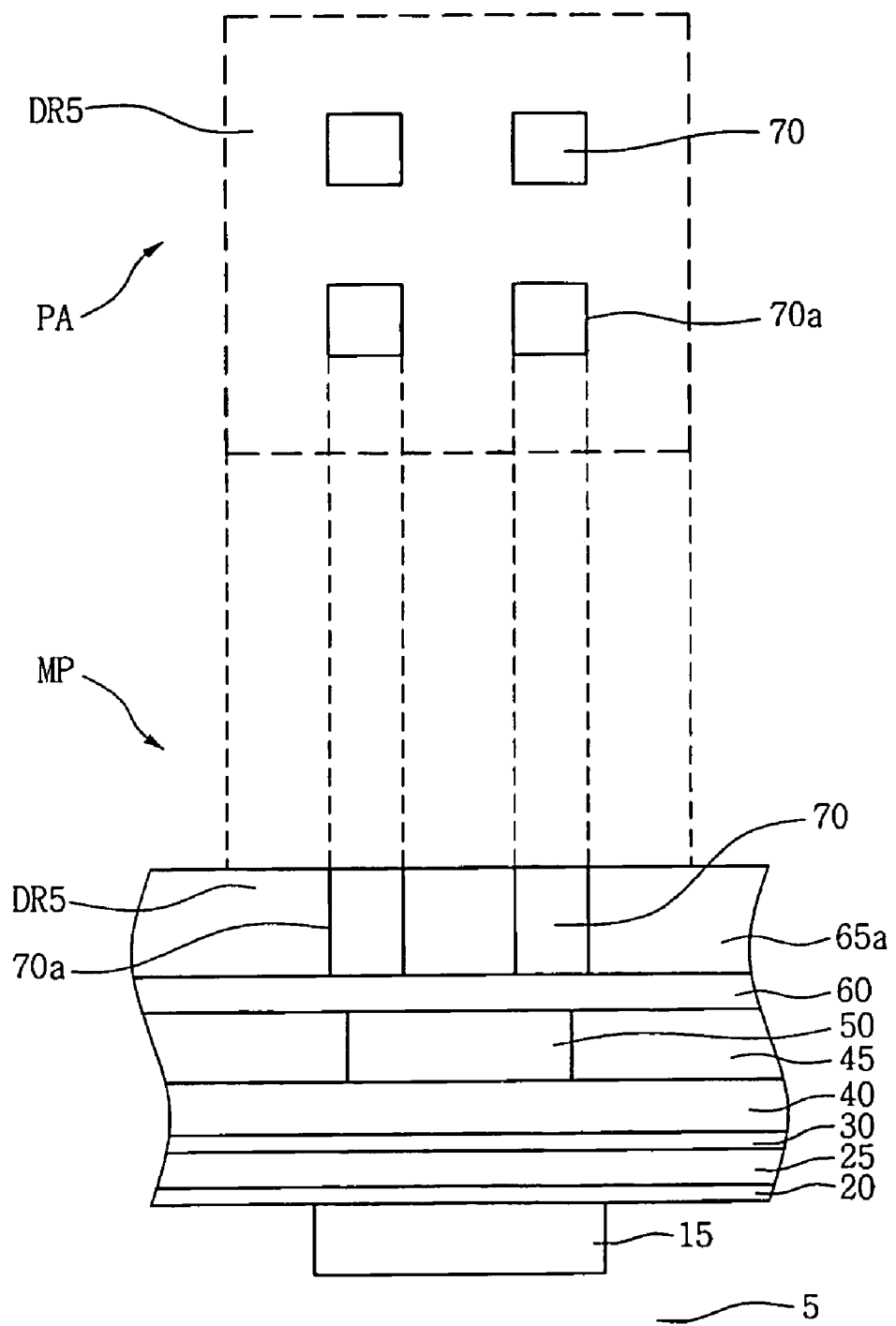

FIGS. 8A and 8B each illustrate a plan view and a longitudinal cross-sectional view of the semiconductor chip having the I/O pad array region PA where the process monitoring pattern MP is formed, according to exemplary embodiments. Specifically, FIGS. 8A and 8B illustrate the process monitoring pattern MP formed in the I/O pad array region PA during formation of a storage node contact.

Referring to FIG. 8A, a fifth interlayer insulating layer 65a may be formed. The fifth interlayer insulating layer 65a may be called a molding insulating layer in a DRAM semiconductor device. Although capping layers (not shown) may be formed above and/or below the fifth interlayer insulating layer 65a, they are omitted from FIGS. 8A and 8B for simplicity. In an exemplary embodiment, after the fifth interlayer insulating layer 65a is formed, its thickness may be measured.

Referring to FIG. 8B, a second opening 70a and a second plug 70 may be formed in the fifth interlayer insulating layer 65a. The second opening 70a may be formed simultaneously with a storage contact hole, while the second plug 70 may be formed simultaneously with a storage node contact plug. After the fifth interlayer insulating layer 65a having the second opening 70a is formed, a conductive layer may be formed to fill the second opening 70a and extend onto the fifth interlayer insulating layer 65a. Thereafter, the conductive layer may be planarized using, for example, a CMP process, thereby forming a fifth interlayer insulating layer 65a and the second plug 70 having flattened surfaces as shown in FIG. 8B. In this case, when the second plug 70 is formed of a metal, it may be formed by an electroplating process or an electroless plating process. In an exemplary embodiment, the fifth interlayer insulating layer 65a may function as a fifth dam region DR5 or a fifth dam during the formation of the second plug 70. Moreover, the fifth dam region DR5 and fifth dam may have the same function and serve the same purpose as the first dam region DR1 and first dam as discussed above.

Figure 9A:
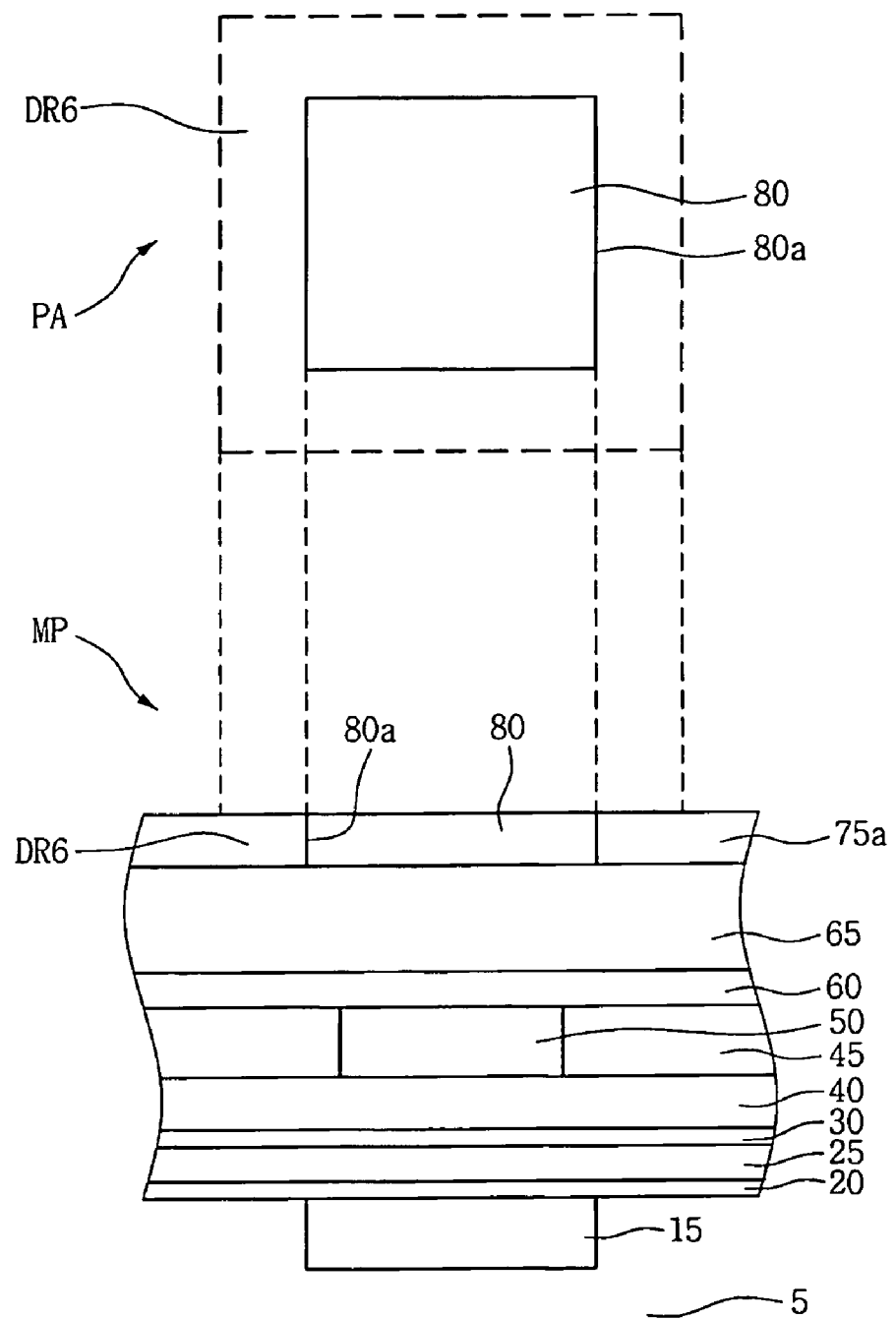
Figure 9B:
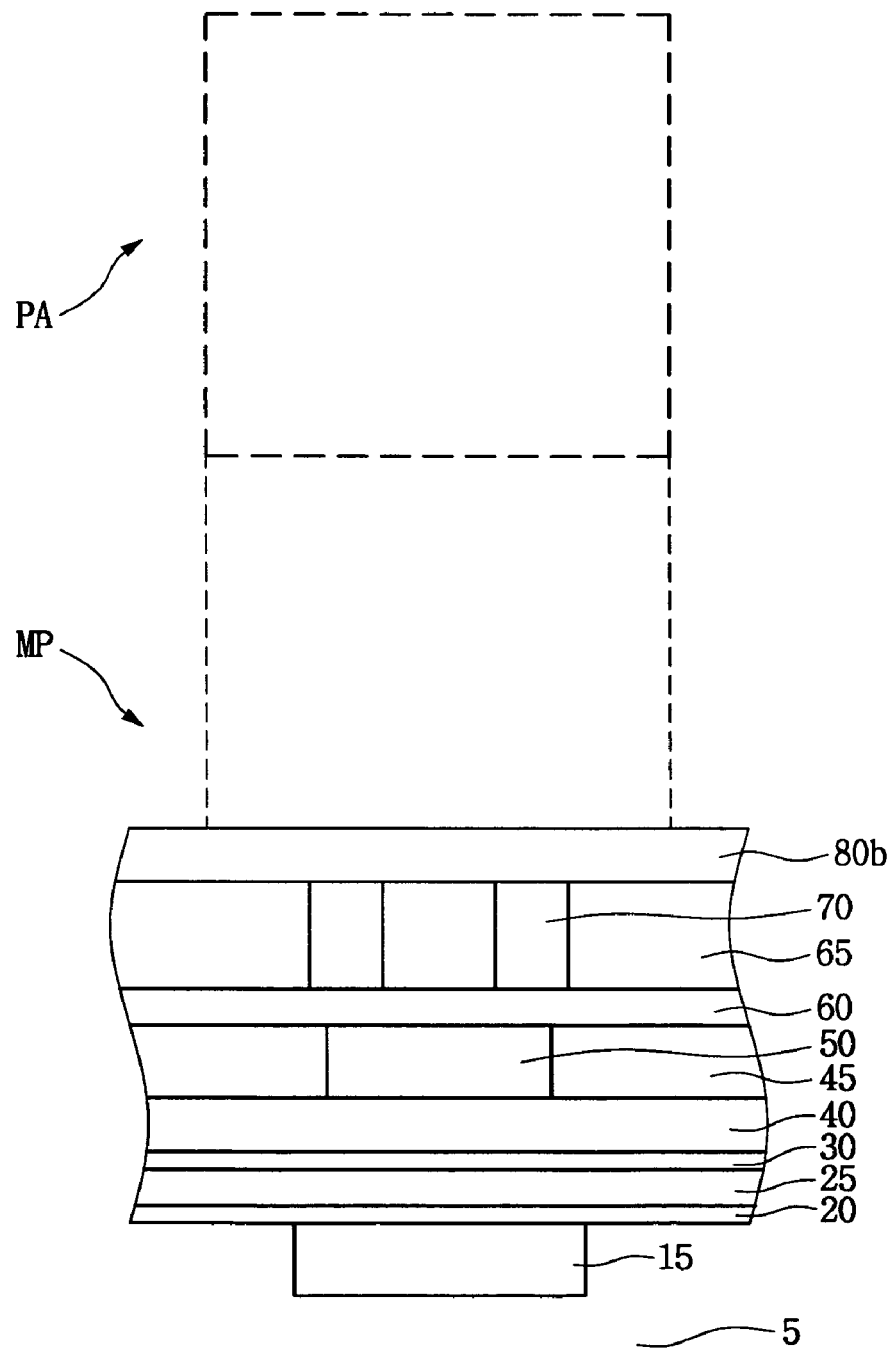

FIGS. 9A and 9B each illustrate a plan view and a longitudinal cross-sectional view of the semiconductor chip having the I/O pad array region PA where the process monitoring pattern MP is formed, according to exemplary embodiments. Specifically, FIGS. 9A and 9B illustrate the process monitoring pattern MP in the I/O pad array region PA during formation of an upper electrode.

Referring to FIG. 9A, a sixth interlayer insulating layer 75a and a third conductor pattern 80 may be formed. In the process of forming a plate electrode of a DRAM semiconductor device, the third conductor pattern 80 may be formed simultaneously with the plate electrode. In an exemplary embodiment, after the sixth interlayer insulating layer 75a is formed, its thickness may be measured. Also, after the third conductor pattern 80 is formed, its thickness may be measured. In an exemplary embodiment, the sixth interlayer insulating layer 75a may function as a sixth dam region DR6 or a sixth dam during the formation of the third conductor pattern 80. Moreover, the sixth dam region DR6 and sixth dam may have the same function and serve the same purpose as the first dam region DR1 and first dam as discussed above.

FIG. 9B illustrates a case where a third conductor 80b is formed on substantially an entire surface of the I/O pad array region PA. Alternatively, the exemplary embodiment shown in FIG. 9B may be modified to include the sixth interlayer insulating layer, which may be formed on substantially the entire surface of the I/O pad array region PA. In an exemplary embodiment, after the sixth interlayer insulating layer and/or the third conductor 80b are formed, their thickness may be measured.

Figure 10A:
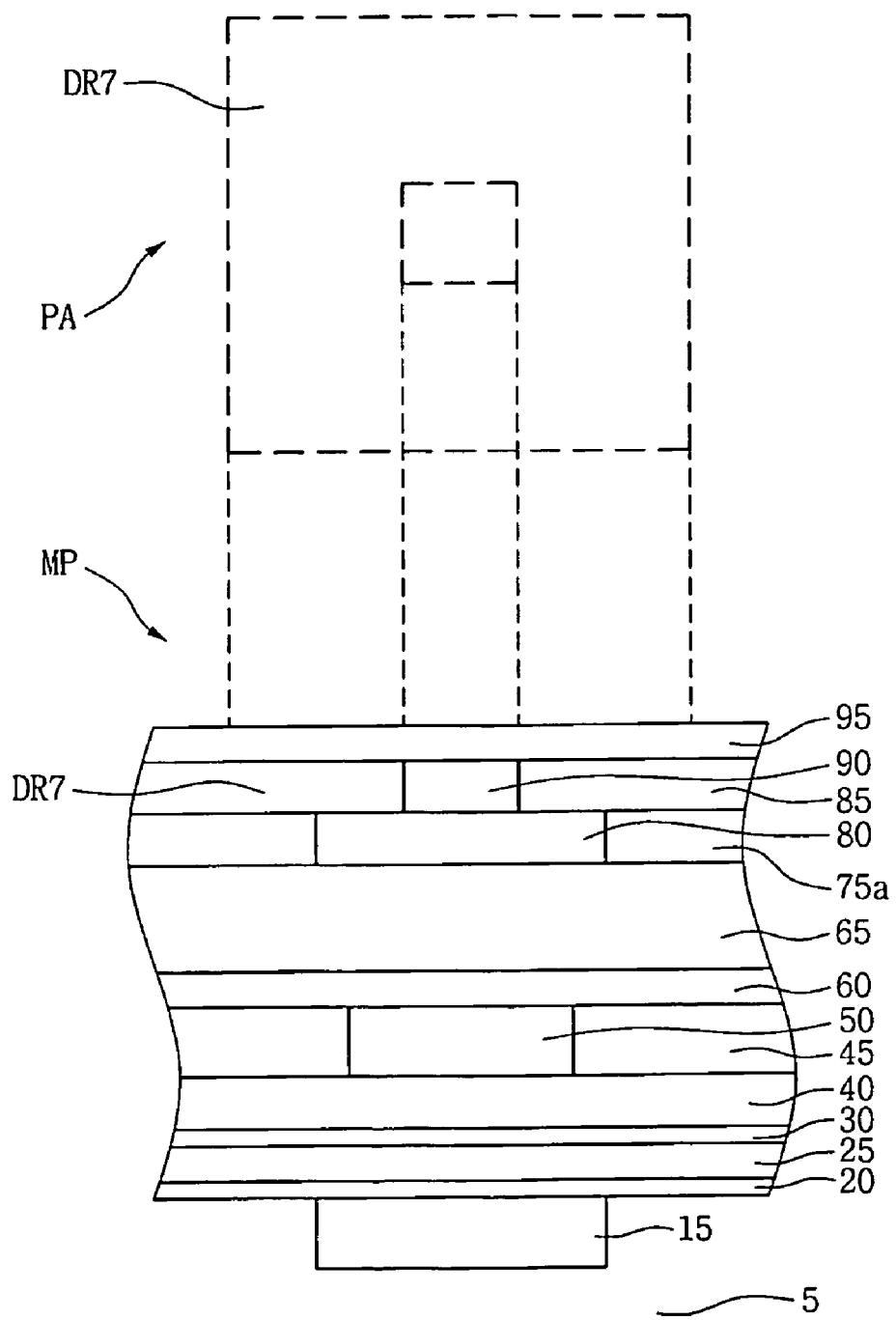
Figure 10B:
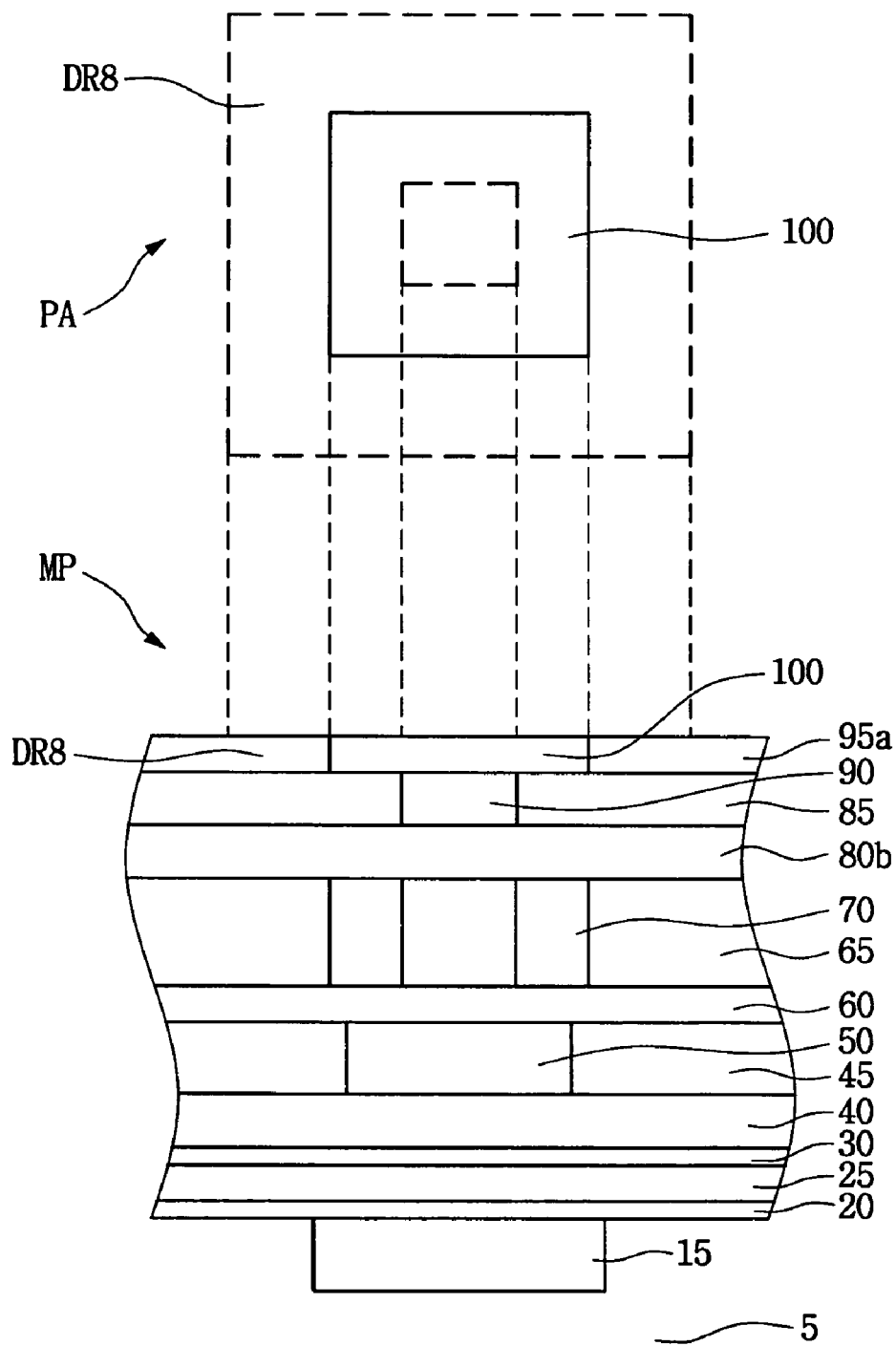

FIGS. 10A and 10B each illustrate a plan view and a longitudinal cross-sectional view of the semiconductor chip having the I/O pad array region PA where the process monitoring pattern MP is formed, according to exemplary embodiments. Specifically, FIGS. 10A and 10B illustrate the process monitoring pattern MP formed in the I/O pad array region PA during formation of a metal contact.

Referring to FIG. 10A, a seventh interlayer insulating layer 85 and a third plug 90 may be formed in the I/O pad array region PA, and an eighth interlayer insulating layer 95 may be formed on substantially an entire surface of the I/O pad array region PA having the seventh interlayer insulating layer 85 and the third plug 90. The third plug 90 may be formed simultaneously with a metal contact during a metal contact forming process of a semiconductor manufacturing process. In an exemplary embodiment, after the eighth interlayer insulating layer 95 is formed, its thickness may be measured. Also, after the third plug 90 is formed, its thickness may be measured. In an exemplary embodiment, the seventh interlayer insulating layer 85 may function as a seventh region DR7 or a seventh dam during the formation of the third plug 90. Moreover, the seventh dam region DR7 and seventh dam may have the same function and serve the same purpose as the first dam region DR1 and first dam as discussed above.

Referring to FIG. 10B, the seventh interlayer insulating layer 85 and the third plug 90 may be formed in the I/O pad array region PA, and an eighth interlayer insulating layer 95a and a fourth conductor 100 may be formed thereon. In the process of forming a metal interconnection, the fourth conductor 100 may be formed simultaneously with the metal interconnection. In the present example embodiment, after the seventh interlayer insulating layer 85 is formed, after the third plug 90 is formed, after the eighth interlayer insulating layer 95a is formed, and/or after the fourth conductor 100 is formed, their thicknesses may be respectively or repeatedly measured. In an exemplary embodiment, the eighth interlayer insulating layer 95a may function as an eighth dam region DR8 or an eighth dam during the formation of the fourth conductor 100. Moreover, the eighth dam region DR8 and eighth dam may have the same function and serve the same purpose as the first dam region DR1 and first dam as discussed above.

Figure 11A:
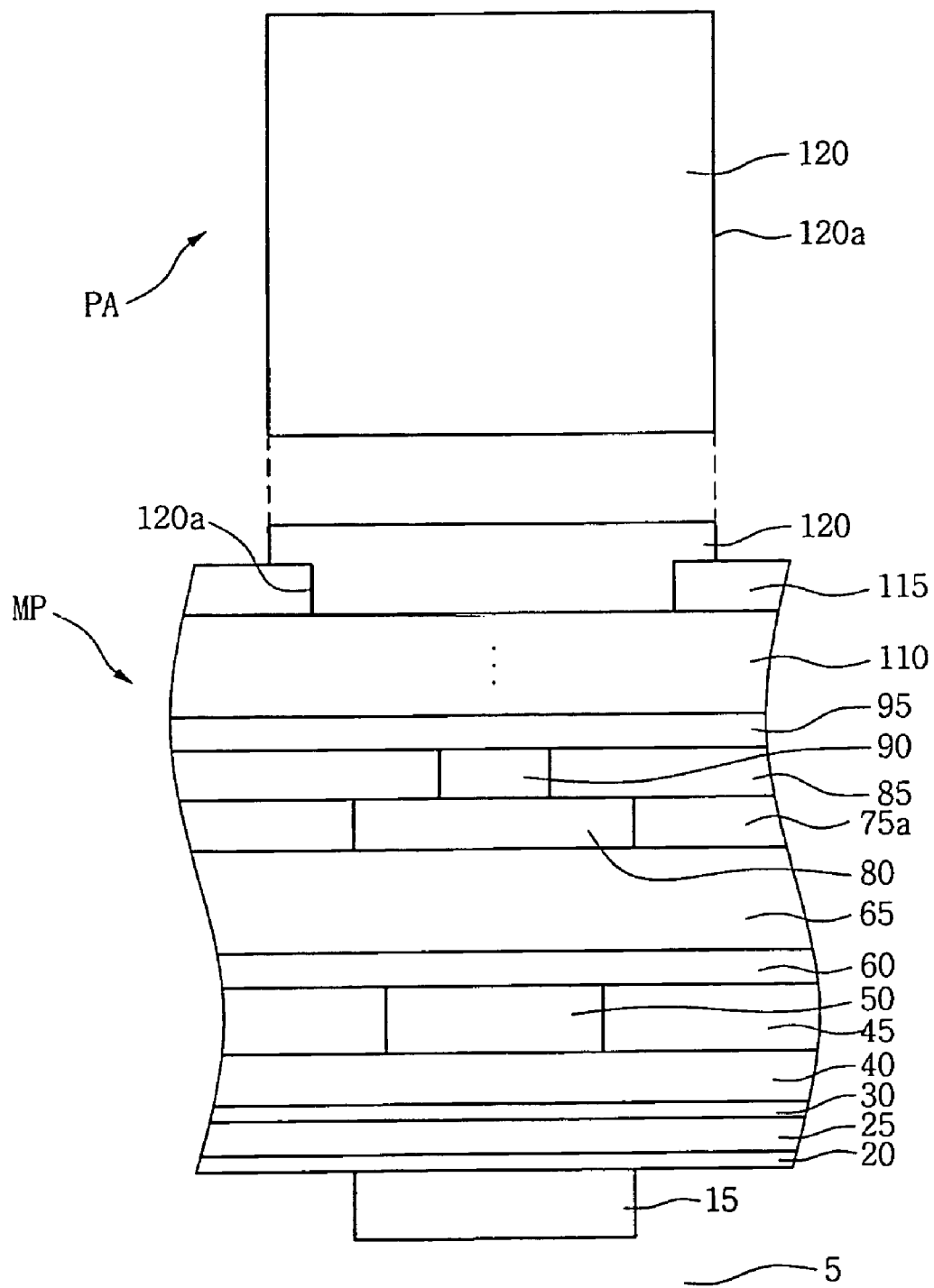
FIGS. 11A and 11B illustrate a plan view and a longitudinal sectional view of a semiconductor chip including an I/O pad formed on a process monitoring pattern according to various exemplary embodiments.
Figure 11B:
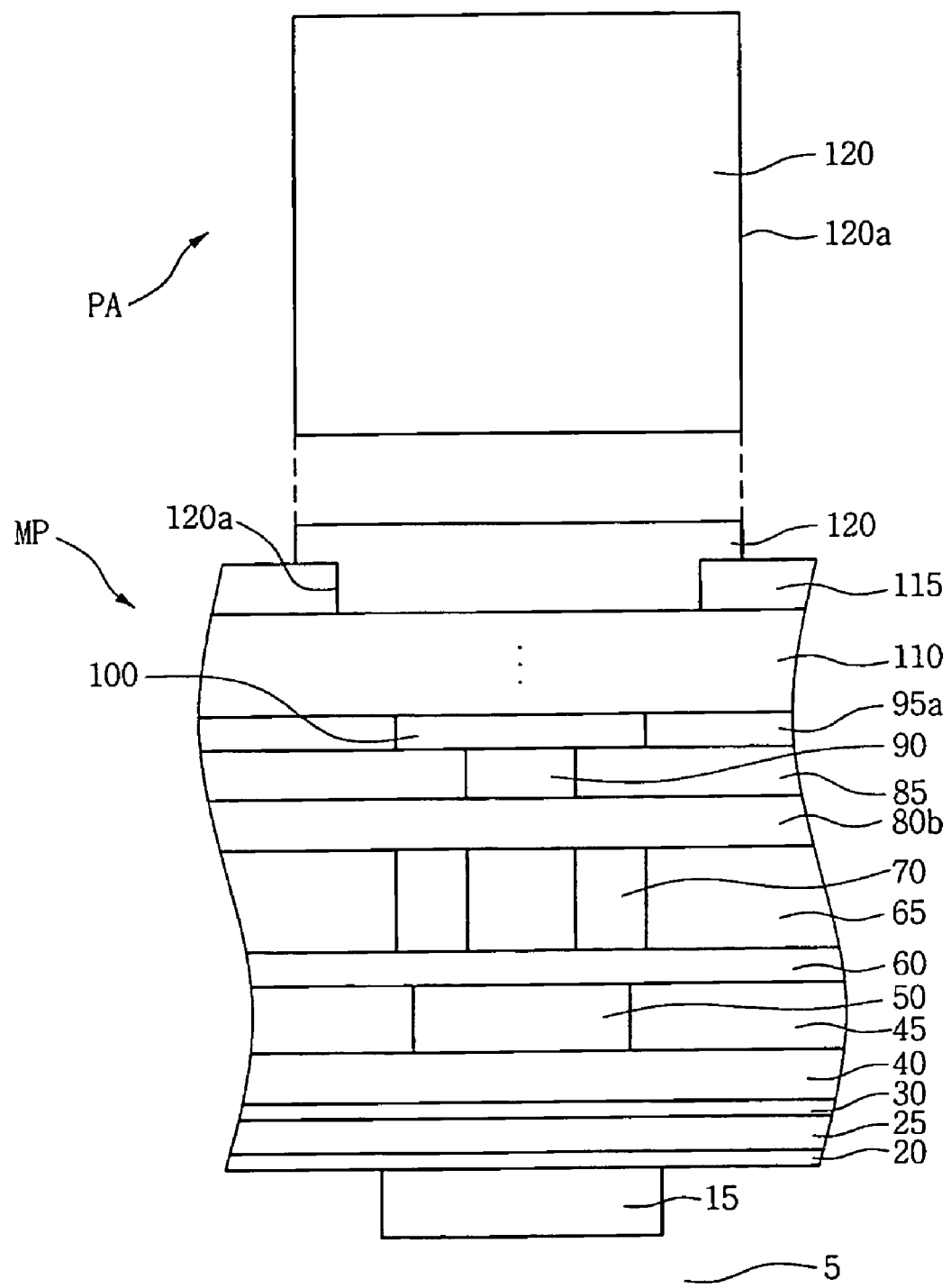

FIGS. 11A and 11B each illustrate a plan view and a longitudinal cross-sectional view of semiconductor chips having I/O pads formed on process monitoring patterns MP, according to exemplary embodiments. Processes for forming various metal contacts and metal interconnections may be performed after the processes described with reference to FIGS. 10A and 10B and before those to be described with reference to FIGS. 11A and 11B. That is, FIGS. 11A and 11B omit these intermediate processes and schematically illustrate final semiconductor chips having the I/O pads.

Referring to FIGS. 11A and 11B, an I/O pad 120 may be formed on top of a semiconductor chip. A third opening 120a may be formed in a passivation layer 115 and filled with the I/O pad 120. In an exemplary embodiment, a material layer 110 formed under the passivation layer 115 is not formed of a specific material and may be any material layer. That is, for example, the material layer 110 may be a conductive layer or a nonconductive layer because the intermediate processes for forming metal interconnections are omitted.

The I/O pad 120 may be electrically insulated from conductive patterns formed on an underlying process monitoring pattern MP. Even if the I/O pad 120 is electrically connected to the conductive patterns of the process monitoring pattern MP, circuits may be configured not to affect the operation of the semiconductor device. However, in order to prevent performance degradation of the semiconductor device and to improve the operational stability of the semiconductor device, the I/O pad 120 may be electrically insulated from the conductive patterns of the process monitoring pattern MP.

Typically, after a storage pattern, e.g., including a lower storage node, a capacitor dielectric layer, and an upper plate node, is formed, metal interconnections formed during a metal interconnection forming process may be electrically connected to the I/O pad 120, thereby constructing a circuit. Accordingly, before the metal interconnection forming process is performed, no pattern is typically formed in a region where the I/O pad 120 is formed. In exemplary embodiments, unlike in the conventional case where a process monitoring pattern MP is formed on a scribe lane, the process monitoring pattern MP is formed in the region where the I/O pad 120 is formed so that the area of a scribe lane may be reduced. Also, more precise measurements may be obtained than in the conventional case where the process monitoring pattern MP is formed in the scribe lane. Furthermore, the process monitoring pattern MP may remain on the semiconductor chip, thus aiding in tracking back a semiconductor manufacturing process.

Figure 12:
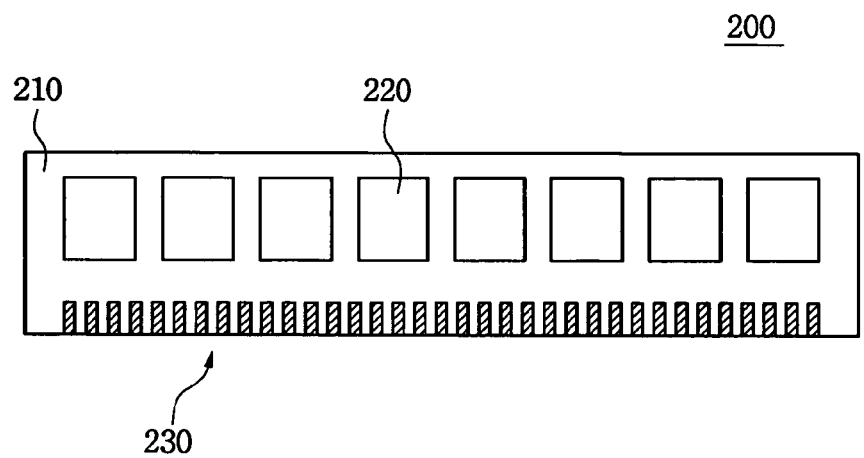
FIG. 12 illustrates a semiconductor module according to an exemplary embodiment.

FIG. 12 illustrates a semiconductor module according to an exemplary embodiment. Referring to FIG. 12, a semiconductor module 200 may include a module substrate 210, a plurality of semiconductor packages 220 disposed on the module substrate 210, and a plurality of contact terminals 230 formed at edge of the module substrate 210 and connected to the plurality of semiconductor packages 220, respectively. The module substrate 210 may be a printed circuit board. Both sides of the module substrate 210 may be used. In other words, the semiconductor devices may be disposed on both sides of the module substrate 210. One of the semiconductor packages 220 may be a control device to control the other semiconductor packages 220. Or, another semiconductor package to control the plurality of semiconductor packages 220 may be further disposed.

Referring to FIG. 12, at least one of the semiconductor packages 220 may include at least one of the semiconductor devices according to exemplary embodiments discussed above. The contact terminals 230 may be formed of metals. The contact terminals 230 may be variously formed and/or disposed on the module substrate. Thus, the number of the contact terminals 230 does not have any specification and may vary. The semiconductor packages 220 may be interpreted as the semiconductor devices according to exemplary embodiments discussed above.

Figure 13:
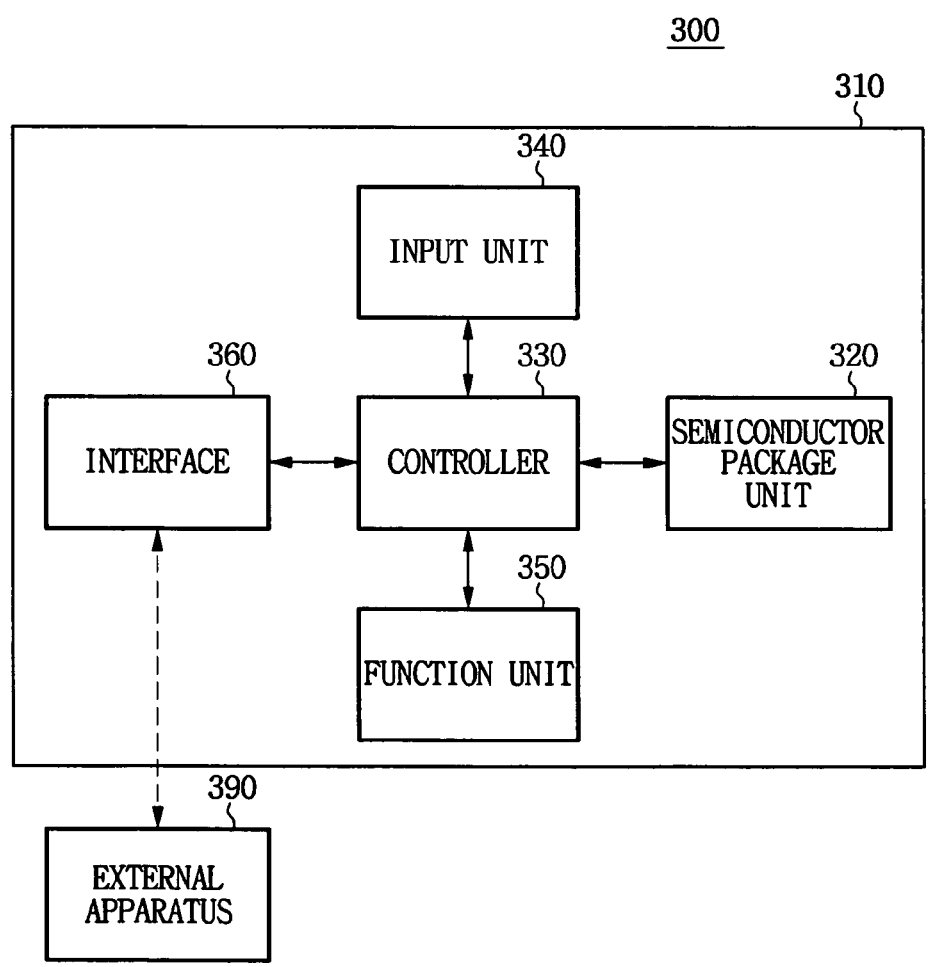
FIG. 13 illustrates a block diagram of an electronic apparatus according to an exemplary embodiment.

FIG. 13 illustrates a block diagram of an electronic apparatus 300 according to an exemplary embodiment. Referring to FIG. 13, the electronic apparatus 300 may include a housing 310 to accommodate elements or units of the electronic apparatus 300, a memory unit 820, a controller 830, an input/output unit 840, a function unit 850, and/or an interface unit 360 to communicate with an external apparatus 390 through a wired or wireless communication line to receive and transmit data or signal. At least one of the semiconductor devices and/or the semiconductor module can be used as the memory unit 320. Therefore, the memory unit 320 may include semiconductor devices or the semiconductor module. The data may be input through the input/output unit 340, the function unit 350, and/or the external apparatus 390 through the interface unit 360. At least one of the semiconductor devices and the semiconductor module can be included in the controller 330. Therefore, the controller 330 may be referred to as semiconductor devices or the semiconductor module.

The function unit 350 may be a unit to perform a function or operation of the electronic apparatus 300. For example, when the electronic apparatus 300 is an image processing apparatus, a television apparatus, or a monitor apparatus, the function unit 350 may be a display unit to display an image and/or an audio output unit to generate a signal or sound according to the data. When the electronic apparatus is a mobile phone, the function unit 350 may be a mobile phone function unit to perform a mobile phone function, for example, dialing, text messaging, photographing using a camera unit formed on the housing 310, audio and video data processing to be displayed on a display unit formed on the housing 310, etc. When the electronic apparatus is an image forming or scanning apparatus, the function unit 350 may be an image forming unit to feed a printing medium, to form or print an image on the printing medium, or to scan a document or picture to be stored in the memory unit. When the electronic apparatus 300 is a camera or camcorder, the function unit 350 may be a unit to photograph an image as a movie or a still image. The controller 330 controls elements and units of the electronic apparatus 300 or may be a processor.

In addition, the names and functions of components that are not denoted by reference numerals in some drawings will be easily understood from the other drawings and the descriptions thereof.

As described above, a semiconductor device according to example embodiments include a process monitoring pattern overlapping with an I/O pad array region so that the width or area of a scribe lane may be reduced. As a result, the number of semiconductor chips on the wafer may be increased, thereby enhancing productivity and yield of the semiconductor device.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
a semiconductor substrate having at least two cell array regions and a peripheral circuit array region between the cell array regions, the two cell array regions being opposite each other across the peripheral circuit array region;
a plurality of process monitoring patterns disposed in the peripheral circuit array region; and
a plurality of input/output (I/O) pads, each I/O pad being disposed above at least one corresponding process monitoring pattern including a conductive material, each I/O pad being electrically insulated from the at least one corresponding process monitoring pattern including the conductive material disposed thereunder and being electrically connected to a semiconductor circuit included in at least one of the cell array regions,
wherein the I/O pads and the corresponding process monitoring patterns are vertically aligned and overlap each other.

2. The device as claimed in claim 1, further comprising a trench recessed in the semiconductor substrate.

3. The device as claimed in claim 2, wherein the plurality of process monitoring patterns include a first process monitoring pattern on the semiconductor substrate having a first oxide pattern filled in the trench.

4. The device as claimed in claim 3, wherein the plurality of process monitoring patterns include a second process monitoring pattern including the conductive material disposed on substantially an entire planar surface of the second process monitoring pattern.

5. The device as claimed in claim 4, wherein the plurality of process monitoring patterns include a third process monitoring pattern having a second oxide pattern with at least one opening and a conductive material pattern filling the at least one opening.

6. The device as claimed in claim 5, wherein the third process monitoring pattern includes a second dam region surrounding the opening.

7. The device as claimed in claim 6, wherein the second dam region is a region of the third process monitoring pattern where the first insulating layer is formed.

8. The device as claimed in claim 5, wherein the plurality of process monitoring patterns include a fourth process monitoring pattern having a fourth oxide pattern disposed on substantially an entire planar surface of the fourth process monitoring pattern.

9. The device as claimed in claim 2, wherein the trench has a smaller planar area than each I/O pad.

10. The device as claimed in claim 9, further comprising a first dam region surrounding a vicinity of the trench and arranged under each I/O pad.

11. The device as claimed in claim 10, wherein the first dam region is formed on a surface of the semiconductor substrate.

12. A semiconductor device, comprising:
a semiconductor substrate having at least two cell array regions and a peripheral circuit array region between the cell array regions, the two cell array regions being opposite each other across the peripheral circuit array region;
a plurality of process monitoring patterns disposed in the peripheral circuit array region; and
a plurality of input/output (I/O) pads, each I/O pad being disposed above at least one corresponding process monitoring pattern including a conductive material, each I/O pad being electrically insulated from the at least one corresponding process monitoring pattern including the conductive material disposed thereunder and being electrically connected to a semiconductor circuit included in at least one of the cell array regions, the I/O pads and the corresponding process monitoring patterns being vertically aligned and overlapping each other,
the plurality of process monitoring patterns include,
a first process monitoring pattern including a trench, a first oxide pattern in the trench, a first dam region surrounding a vicinity of the trench, the first dam region being a portion of the semiconductor substrate;
a second process monitoring pattern including a conductive material layer disposed on substantially an entire planar surface of the second process monitoring pattern;
a third process monitoring pattern including a second oxide pattern with at least one opening and a conductive material pattern filling the at least one opening and a second dam region surrounding the opening, the second dam region being a region of the third process monitoring pattern where the first insulating layer is formed; and
a fourth process monitoring pattern including a fourth oxide pattern disposed on substantially an entire planar surface of the fourth process monitoring pattern.

13. A semiconductor device, comprising:
a circuit region including at least two cell array regions and a peripheral circuit array region between the cell array regions, and the two cell array regions being opposite each other across the peripheral circuit array region;

an input/output (I/O) pad array region including a plurality of I/O pads; and a plurality of process monitoring patterns, at least one of the process monitoring patterns overlapping with at least one of the I/O pads, wherein:

each I/O pad is disposed above at least one correspond process monitoring pattern including a conductive material, each I/O pad being electrically insulated from the at least one corresponding process monitoring pattern including the conductive material disposed thereunder and being electrically connected to a semiconductor circuit included in at least one of the cell array regions, and the I/O pads and the corresponding process monitoring patterns are vertically aligned and overlap each other.

14. The devices as claimed in claim 13, wherein the circuit region includes the semiconductor circuit electrically connected to the corresponding I/O pad and electrically insulated from the corresponding process monitoring pattern.

15. A semiconductor module comprising:

a module substrate;

semiconductor devices disposed on the module substrate; and contact terminals disposed at edge of the module substrate, wherein at least one of the semiconductor devices includes:

a semiconductor substrate having at least two cell array regions and a peripheral circuit array region between the cell array regions, the two cell array regions being opposite each other across the peripheral circuit array region;

a plurality of process monitoring patterns disposed in the peripheral circuit array region; and a plurality of input/output (I/O) pads, each I/O pad being disposed above at least one corresponding process monitoring pattern including a conductive material, each I/O pad being electrically insulated from the at least one corresponding process monitoring pattern including the conductive material disposed thereunder and being electrically connected to a semiconductor circuit included in at least one of the cell array regions, and the I/O pads and the corresponding process monitoring patterns being vertically aligned and overlapping each other.

16. An electronic apparatus comprising, a housing;

a memory unit in the housing, the memory unit including a semiconductor device;

an input/output unit; and a controller to control the memory unit and the input/output unit, wherein the semiconductor device includes:

a semiconductor substrate having at least two cell array regions and a peripheral circuit array region between the cell array regions, the two cell array regions being opposite each other across the peripheral circuit array region;

a plurality of process monitoring patterns disposed in the peripheral circuit array region; and a plurality of input/output (I/O) pads, each I/O pad being disposed above at least one corresponding process monitoring pattern including a conductive material, each I/O pad being electrically insulated from the at least one corresponding process monitoring pattern including the conductive material disposed thereunder and being electrically connected to a semiconductor circuit included in at least one of the cell array regions, and the I/O pads and the corresponding process monitoring patterns being vertically aligned and overlapping each other.

* * * * *